US012317693B2

(12) United States Patent
Lee et al.

(10) Patent No.: US 12,317,693 B2
(45) Date of Patent: May 27, 2025

(54) DISPLAY DEVICE AND METHOD OF MANUFACTURING THE SAME

(71) Applicant: SAMSUNG DISPLAY CO., LTD., Yongin-si (KR)

(72) Inventors: Sung Jin Lee, Yongin-si (KR); Jong Chan Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/628,478

(22) Filed: Apr. 5, 2024

(65) Prior Publication Data

US 2024/0251606 A1  Jul. 25, 2024

Related U.S. Application Data

(62) Division of application No. 17/445,277, filed on Aug. 17, 2021, now Pat. No. 11,957,003.

(30) Foreign Application Priority Data

Aug. 31, 2020 (KR) .................. 10-2020-0110033

(51) Int. Cl.
  *H10K 59/122* (2023.01)
  *H10K 59/124* (2023.01)
  *H10K 71/00* (2023.01)

(52) U.S. Cl.
  CPC ......... *H10K 59/122* (2023.02); *H10K 59/124* (2023.02); *H10K 71/00* (2023.02)

(58) Field of Classification Search
  None
  See application file for complete search history.

(56) References Cited

U.S. PATENT DOCUMENTS

| | | | |
|---|---|---|---|
| 2020/0005703 A1* | 1/2020 | Kim | H10K 59/131 |
| 2021/0305222 A1* | 9/2021 | Min | H01L 25/167 |
| 2021/0408506 A1* | 12/2021 | Wu | H10K 59/35 |
| 2023/0055222 A1 | 2/2023 | Jeong et al. | |
| 2023/0207571 A1 | 6/2023 | Hong et al. | |

FOREIGN PATENT DOCUMENTS

| | | |
|---|---|---|
| KR | 10-2018-0072909 A | 7/2018 |
| KR | 10-2019-0006430 A | 1/2019 |
| KR | 10-2020-0016424 A | 2/2020 |
| KR | 10-2020-0034896 A | 4/2020 |
| KR | 10-2020-0034904 A | 4/2020 |

* cited by examiner

*Primary Examiner* — Michelle Mandala
(74) *Attorney, Agent, or Firm* — Womble Bond Dickinson (US) LLP

(57) ABSTRACT

A display device includes a planarization layer on a substrate, a plurality of inner banks and a plurality of outer banks arranged on the planarization layer and extending in one direction, a first alignment electrode and a second alignment electrode on the plurality of inner banks and spaced from each other, a light emitting element on the first alignment electrode and the second alignment electrode and located between the first alignment electrode and the second alignment electrode, and a first contact electrode on the first alignment electrode and contacting a first end of the light emitting element, and a second contact electrode on the second alignment electrode and contacting a second end of the light emitting element. The plurality of outer banks are in contact with the plurality of inner banks at the same layer, and are spaced from each other with the plurality of inner banks interposed therebetween.

5 Claims, 19 Drawing Sheets

EBNL1: LA1, PR1, PR2, PR3
EBNL2: LA2, PR4, PR5, PR6

EBNL1: LA1, PR1, PR2, PR3
EBNL2: LA2, PR4, PR5, PR6, PR7, PR8, PR9

DISPLAY DEVICE AND METHOD OF MANUFACTURING THE SAME

CROSS-REFERENCE TO RELATED APPLICATIONS

This application is a divisional of U.S. patent application Ser. No. 17/445,277, filed Aug. 17, 2021, which claims priority to and the benefit of Korean Patent Application No. 10-2020-0110033, filed Aug. 31, 2020, the entire content of both of which is incorporated herein by reference.

BACKGROUND

1. Field

The present disclosure relates to a display device and a method of manufacturing the same.

2. Description of the Related Arts

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

Aspects of the present disclosure are to provide a display device capable of preventing or reducing the overflow of ink to adjacent sub-pixels and substantially simplifying a mask process.

According to an embodiment of the disclosure, the display device, includes a planarization layer on a substrate, a plurality of inner banks and a plurality of outer banks arranged on the planarization layer and extending in one direction, a first alignment electrode and a second alignment electrode on the plurality of inner banks and spaced from each other, a light emitting element on the first alignment electrode and the second alignment electrode and located between the first alignment electrode and the second alignment electrode, and a first contact electrode on the first alignment electrode and contacting a first end of the light emitting element, and a second contact electrode on the second alignment electrode and contacting a second end of the light emitting element, wherein the plurality of outer banks are in contact with the plurality of inner banks at a same layer, and are spaced from each other with the plurality of inner banks interposed therebetween.

In an embodiment, the plurality of inner banks and the plurality of outer banks are in contact with the planarization layer.

In an embodiment, the plurality of inner banks have an island shape, and the plurality of outer banks have a line shape continuously extending in the one direction.

In an embodiment, the plurality of inner banks and the plurality of outer banks have a same height.

In an embodiment, each of the plurality of outer banks includes a linear portion parallel to the plurality of inner banks and a plurality of protrusion portions protruding from the linear portion toward the plurality of inner banks and spaced from each other.

In an embodiment, the plurality of outer banks include a first outer bank and a second outer bank adjacent to each other, and the plurality of protrusion portions of the second outer bank are arranged along imaginary lines passing through the plurality of protrusion portions of the first outer bank.

In an embodiment, the first alignment electrode and the second alignment electrode are located between the plurality of protrusion portions of the first outer bank and the plurality of protrusion portions of the second outer bank.

In an embodiment, distances between the protrusion portions of the first outer bank and respective ones of the protrusion portions of the second outer bank are same as each other.

In an embodiment, distances between the protrusion portions of the first outer bank and respective ones of the protrusion portions of the second outer bank are different from each other.

In an embodiment, the plurality of inner banks include a first inner bank and a second inner bank adjacent to each other, and a distance between the protrusion portion of the first outer bank and respective ones of the protrusion portions of the second outer bank is greater than a distance from one side of the first inner bank to other side of the second inner bank.

In an embodiment, distances between the linear portions of the plurality of outer banks in each sub-pixel are same as each other.

In an embodiment, the first alignment electrode and the second alignment electrode overlap the plurality of inner banks, and do not overlap the plurality of outer banks.

In an embodiment, the display device further comprises a first insulating layer between the first alignment electrode and the light emitting element and between the second alignment electrode and the light emitting element, wherein the first insulating layer does not overlap at least a part of the planarization layer.

According to an embodiment of the disclosure, the display device, includes a substrate having a plurality of light emission areas, a plurality of inner banks extending in one direction on the substrate and located in the light emission areas and a plurality of outer banks located outside the light emission areas, a first alignment electrode and a second alignment electrode extending in the one direction and overlapping the plurality of inner banks in the light emission areas, a light emitting element between the first alignment electrode and the second alignment electrode, and a first contact electrode contacting one end of the light emitting element and the first alignment electrode and a second contact electrode contacting an other end of the light emitting element and the second alignment electrode, wherein the plurality of outer banks do not overlap the first alignment electrode and the second alignment electrode.

In an embodiment, the plurality of outer banks includes protrusion portions protruding toward the inner banks and facing each other, and defines the light emission areas and cut areas adjacent to the light emission areas, wherein the first alignment electrode and the second alignment electrode are shortened with respect to the protrusion portions.

In an embodiment, the plurality of inner banks have an island shape, and the plurality of outer banks have a line shape continuously extending in the one direction.

In an embodiment, from among the plurality of light emission areas, the light emission areas adjacent to each other share respective one of the plurality of outer banks.

According to an embodiment of the disclosure, the method of manufacturing a display device including a substrate including a planarization layer, the method including: concurrently forming a plurality of inner banks and a plurality of outer banks extending in one direction and spaced from each other on the planarization layer, forming a first alignment electrode and a second alignment electrode on the plurality of inner banks, aligning a light emitting element between the first alignment electrode and the second alignment electrode, and forming a first contact electrode contacting a first end of the light emitting element on the first alignment electrode and forming a second contact electrode contacting a second end of the light emitting element on the second alignment electrode.

In an embodiment, the plurality of inner banks and the plurality of outer banks have a same height.

In an embodiment, the plurality of inner banks have an island shape, and the plurality of outer banks have a line shape.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
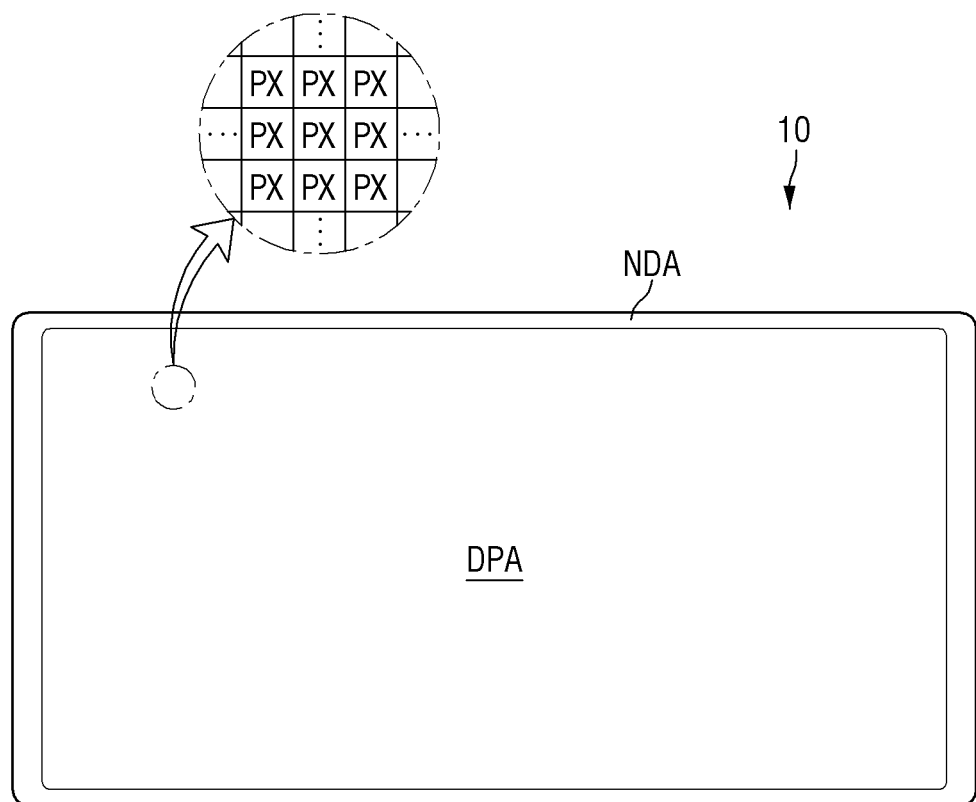
FIG. 1 is a schematic plan view of a display device according to an embodiment.
Figure 1:
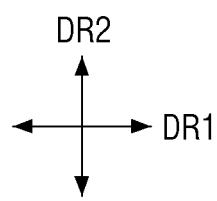

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the disclosure.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

In the present disclosure, it should be understood that the term "include", "comprise", "have", or "configure" indicates that a feature, a number, a step, an operation, a constituent element, a part, or a combination thereof described in the current disclosure is present, but does not exclude a possibility of presence or addition of one or more other features, numbers, steps, operations, constituent elements, parts, or combinations, in advance. It will be understood that when an element such as a layer, film, region, or substrate is referred to as being "on" another element, it can be directly on the other element or intervening elements may also be present. In the present disclosure, when a portion of a layer, film, region, area, plate, or the like is referred to as being formed "on" (or "at") another portion, the formed direction is not limited to an upper direction but includes a lateral or lower direction. In contrast, when an element of a layer, film, region, plate, or the like is referred to as being "below" another element, it may be directly below the other element, or intervening elements may be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Each of the features of the various embodiments of the present disclosure may be combined or combined with each other, in part or in whole, and technically various interlocking and driving are possible. Each embodiment may be implemented independently of each other or may be implemented together in an association with one or more other suitable embodiments.

Hereinafter, embodiments of the present disclosure will be described with reference to the attached drawings.

FIG. 1 is a schematic plan view of a display device according to an embodiment.

Referring to FIG. 1, a display device 10 displays a mobile image or a still image. The display device 10 may refer to any electronic device that provides a display screen. For example, the display device 10 may be used in televisions, notebooks, monitors, billboards, internet of things (IoTs), mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorder, and the like.

The display device 10 includes a display panel including a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be discussed, but the present disclosure is not limited thereto. Any display panel may be used as the display panel as long as the same technical idea is applicable.

The shape of the display device 10 may be variously modified. For example, the display device 10 may have a shape such as a rectangle having longer horizontal sides, a rectangle having longer vertical sides, a square, a rectangle having round corners (e.g., vertexes), another polygon, or a circle. The shape of a display area DPA of the display device 10 may also be similar to the overall shape of the display device 10. FIG. 1 illustrates a display device 10 and a display area DPA each having a rectangular shape having longer horizontal sides.

The display device 10 may include a display area DPA and a non-display area NDA (e.g., the non-display area NDA may surround the display area DPA along the edge or periphery of the display area DPA). The display area DPA is an area where an image is displayed, and the non-display area NDA is an area where an image is not displayed. The display area DPA may be referred to as an active area, and the non-display area NDA may be referred to as an inactive area. The display area DPA may generally occupy the center (or the central region) of the display device 10.

The display area DPA may include a plurality of pixels PX. The plurality of pixels PX may be arranged in a matrix direction (e.g., the plurality of pixels PX may be arranged along row and column directions). Each of the pixels PX may have a rectangular shape or a square shape in a plan view, but the shape thereof is not limited thereto. Each of the pixels PX may have a rhombus shape in which each side is inclined with respect to one direction. The respective pixels PX may be alternately arranged in a stripe arrangement or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX includes at least one light emitting element 30 emitting light of a specific wavelength band to display a specific color.

The non-display area NDA may be disposed around the display area DPA. The non-display area NDA may entirely or partially surround the display area DPA along the edge or periphery of the display area. The display area DPA may have a rectangular shape, and the non-display area NDA may be disposed adjacent to four sides of the display area DPA. The non-display area NDA may constitute a bezel of the display device 10. Wirings or circuit drivers included in the display device 10 may be disposed in the non-display area NDA, or external devices may be mounted in the non-display area NDA.

Figure 2:
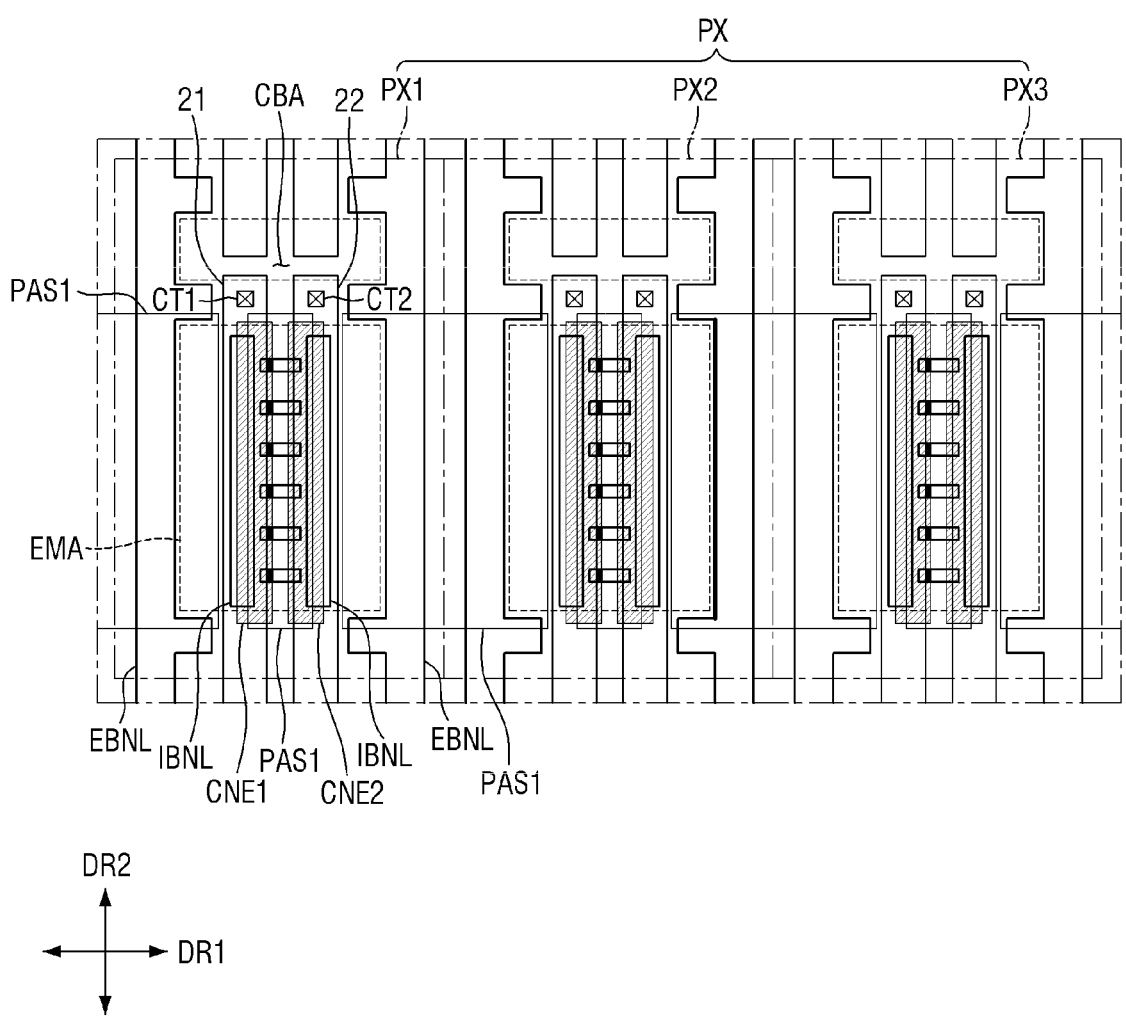
FIG. 2 is a plan view illustrating one pixel of a display device according to an embodiment.

FIG. 2 is a plan view illustrating one pixel of a display device according to an embodiment.

Referring to FIG. 2, each of the pixels PX may include a plurality of sub-pixels PXn (n is an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the present disclosure is not limited thereto, and each of the sub-pixels PXn may emit light of the same color. Although it is shown in FIG. 2 that the pixel PX includes three sub-pixels PXn, the present disclosure is not limited thereto, and the pixel PX may include a larger number of sub-pixels PXn.

Each of the sub-pixels PXn of the display device 10 may include a light emission area EMA and a non-light emission area. The light emission area EMA is defined as an area in which a light emitting element 30 is disposed to emit light of a specific wavelength band, and the non-light emission area is defined as an area in which no light emitting element 30 is disposed and no light is emitted. The light emission area EMA may include an area in which the light emitting element 30 is disposed, and an area adjacent to the light emitting element 30 to discharge light emitted from the light emitting element 30.

However, the present disclosure is not limited thereto, and the light emission area EMA may also include an area in which light emitted from the light emitting element 30 is reflected or refracted by another member and then emitted.

The plurality of light emitting elements 30 may be arranged in each of the sub-pixels PXn, and the light emission area may be formed by an area in which the plurality of light emitting elements 30 are arranged and an area adjacent to this area.

Each of the sub-pixels PXn may include a cut area CBA disposed in the non-light emission area. The cut area CBA may be disposed at one side of the light emission area EMA in the second direction DR2. The cut area CBA may be disposed between the light emission areas EMA of the adjacent sub-pixels PXn in the second direction DR2. A plurality of light emission areas EMA and a plurality of cut areas CBA may be arranged in the display area DPA of the display device 10. For example, the plurality of light emission areas EMA and the plurality of cut areas CBA are repeatedly arranged in the first direction DR1, and may be alternately arranged in the second direction DR2. The distance between the cut areas CBA spaced from each other in the first direction DR1 may be smaller than the distance between the light emission areas EMA spaced from each other in the first direction DR1. Protrusion portions of an outer bank EBNL to be described later may be disposed between the cut areas CBA and the light emission areas EMA. Because the light emitting element 30 is not disposed in the cut area CBA, light is not emitted in the cut area CBA, but a part of each of alignment electrodes 21 and 22 disposed in each of the sub-pixels PXn may be disposed in the cut area CBA. The alignment electrodes 21 and 22 disposed for each of the sub-pixels PXn may be disposed separately from each other in the cut area CBA. However, the present disclosure is not limited thereto, and each of the alignment electrodes 21 and 22 may be disposed in a state that is not separated from the cut area CBA.

Figure 3:
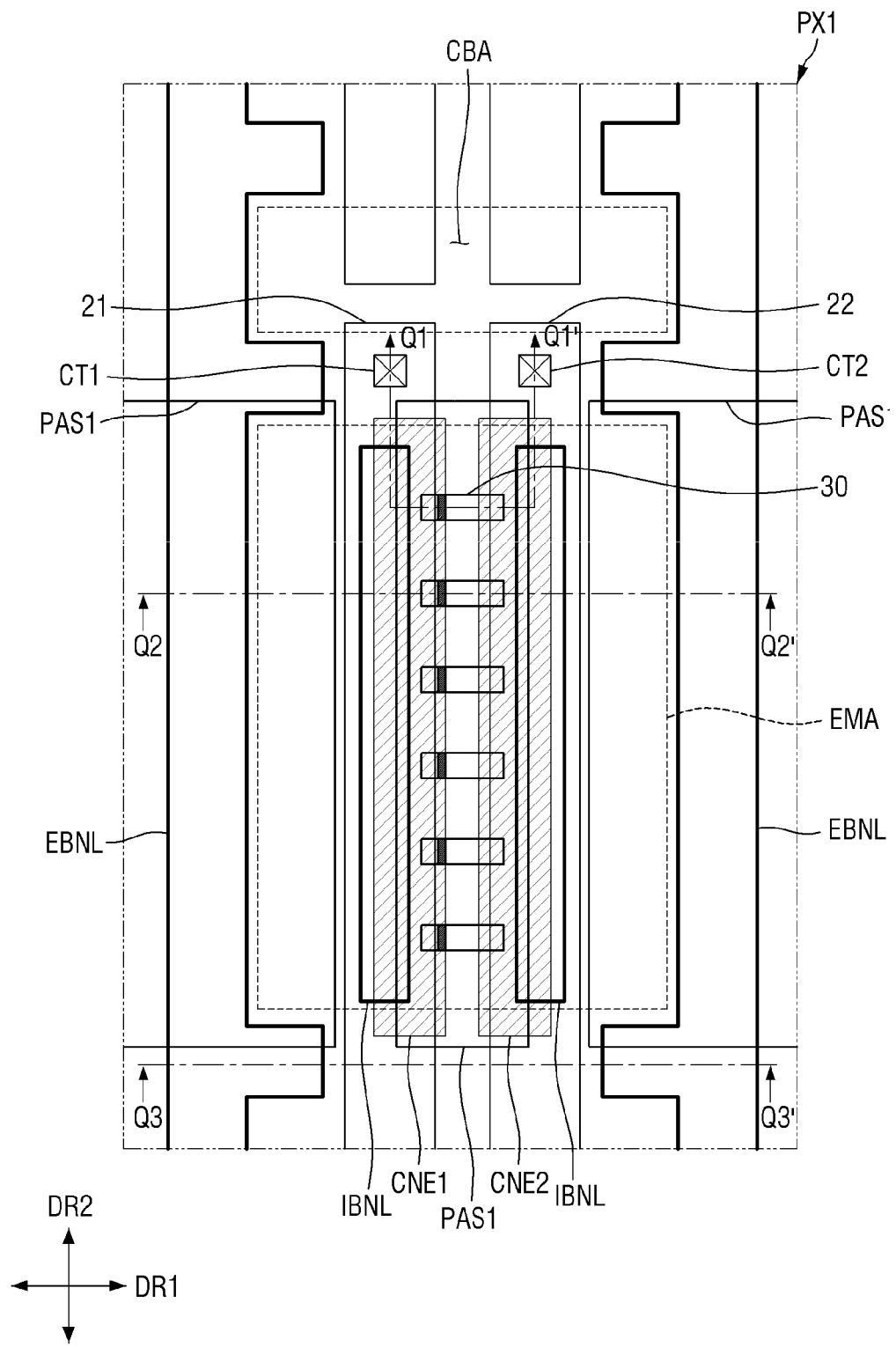
FIG. 3 is a plan view illustrating one sub-pixel of FIG. 2.
Figure 4:
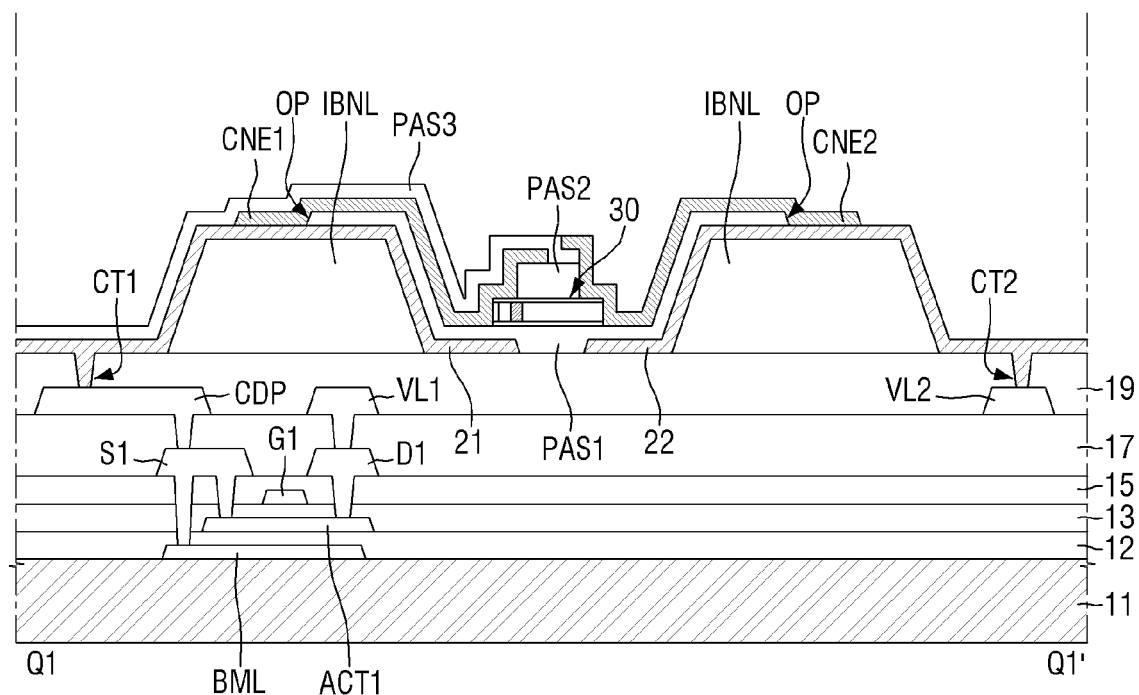
FIG. 4 is a cross-sectional view taken along the line Q1-Q1' of FIG. 3.
Figure 4:
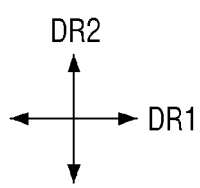
Figure 5:
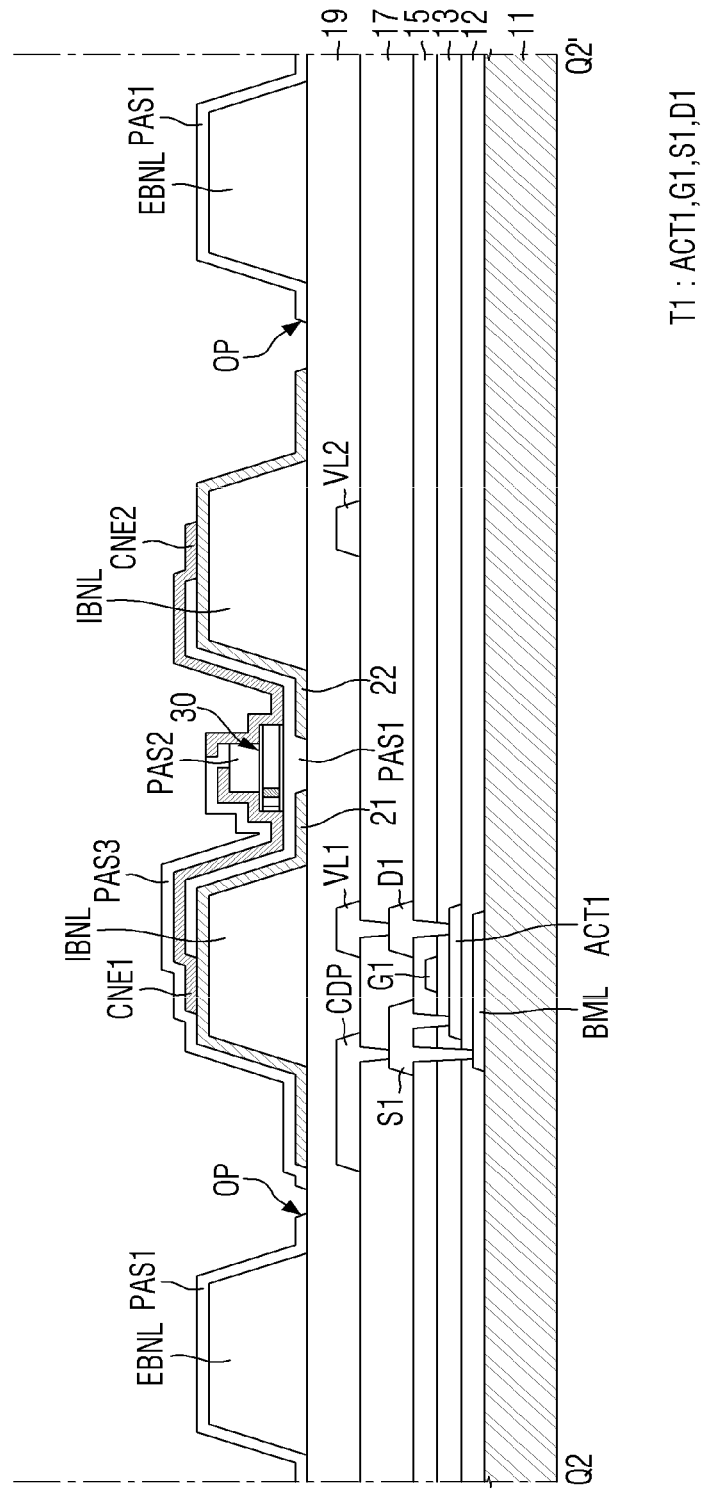
FIG. 5 is a cross-sectional view taken along the line Q2-Q2' of FIG. 3.
Figure 6:
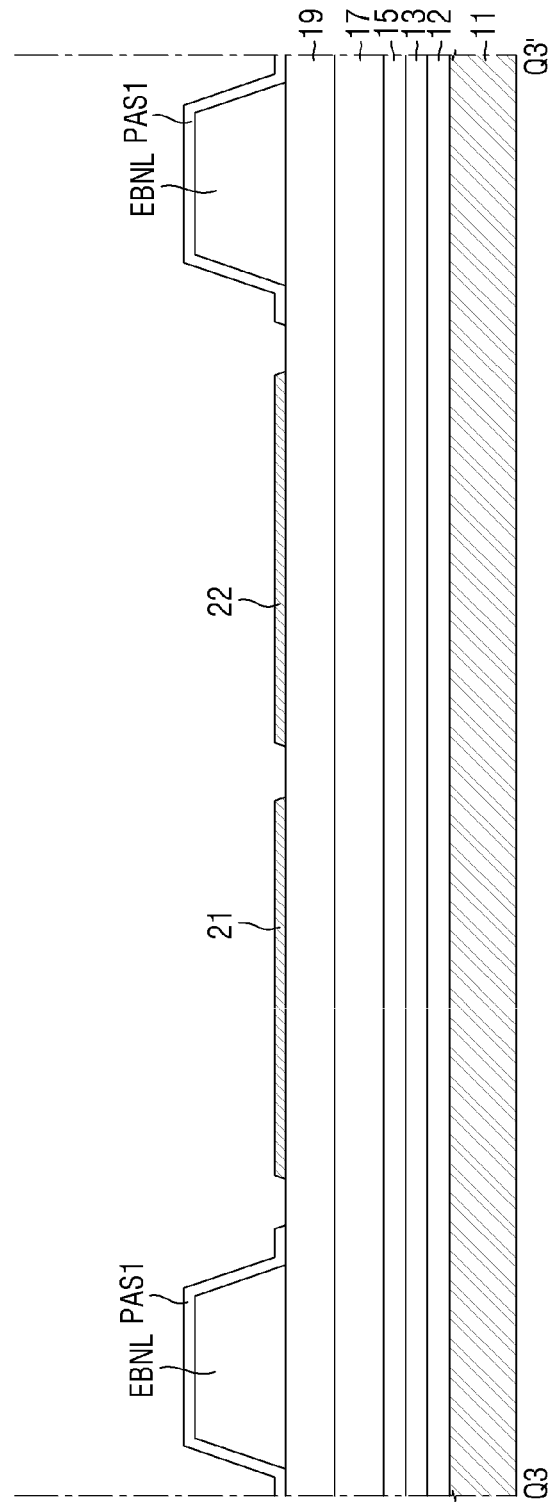
FIG. 6 is a cross-sectional view taken along the line Q3-Q3' of FIG. 3.
Figure 7:
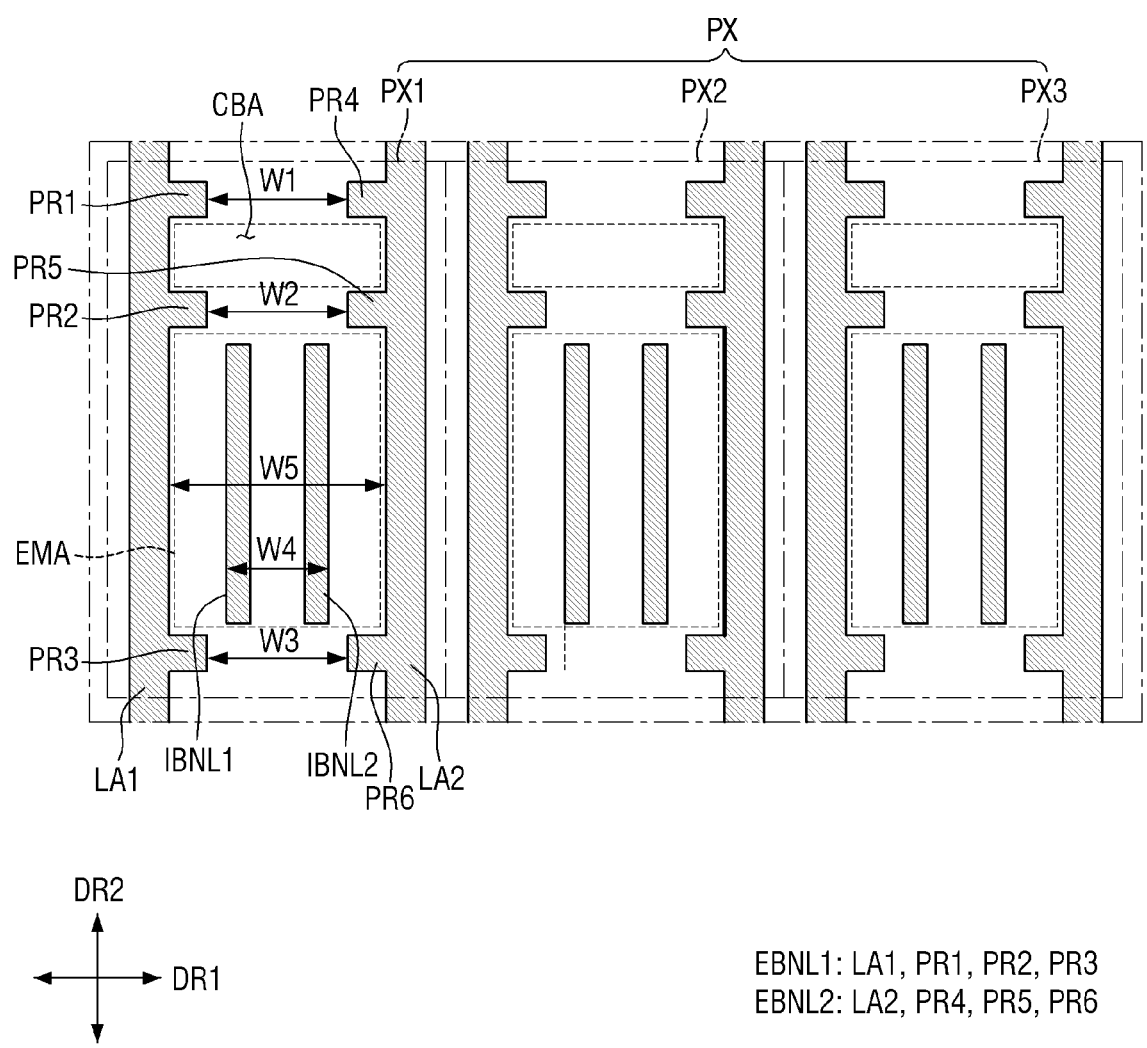
FIG. 7 is a plan view illustrating an example of the inner bank and outer bank of FIG. 2.
Figure 8:
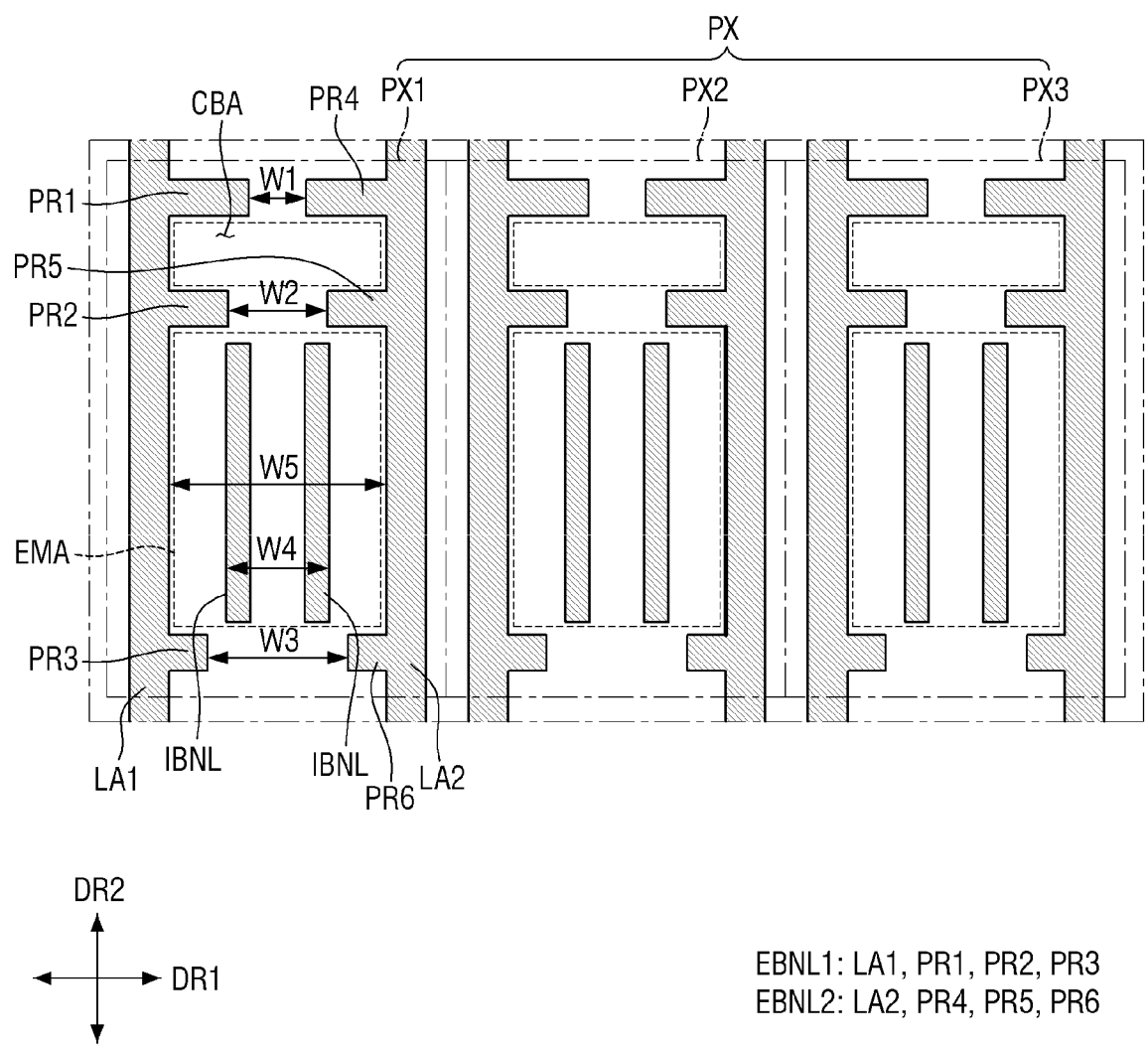
FIG. 8 is a plan view illustrating another example of the inner bank and outer bank of FIG. 2.

FIG. 3 is a plan view illustrating one sub-pixel of FIG. 2. FIG. 4 is a cross-sectional view taken along the line Q1-Q1' of FIG. 3. FIG. 5 is a cross-sectional view taken along the line Q2-Q2' of FIG. 3. FIG. 6 is a cross-sectional view taken along the line Q3-Q3' of FIG. 3. FIG. 7 is a plan view illustrating an example of the inner bank and outer bank of FIG. 2. FIG. 8 is a plan view illustrating another example of the inner bank and outer bank of FIG. 2.

Although FIGS. 4-6 illustrate only a cross section of the first sub-pixel PX1 of FIG. 2, FIGS. 4-6 may be applied to another pixel PX or sub-pixel PXn. FIGS. 4 and 5 illustrate cross-sectional views of one end (e.g., a first end) and the other end (e.g., a second end) of the light emitting element 30 disposed in the first sub-pixel PX1. Further, although FIGS. 4 and 5 illustrate only one first transistor T1, the present disclosure is not limited thereto, and, as described above, three transistors T1, T2, and T3 and one storage capacitor Cst may be disposed in each sub-pixel PXn.

Referring to FIGS. 3-6 together with FIG. 2, the display device 10 may include a substrate 11, and a semiconductor layer, a plurality of conductive layers, and a plurality of insulating layers, which are disposed on the substrate 11. The semiconductor layer, the conductive layers, and the insulating layers may constitute a circuit layer and a light emitting element layer of the display device 10, respectively.

For example, the substrate 11 may be an insulating substrate. The substrate 11 may be made of an insulating material such as glass, quartz, or polymer resin. The substrate 11 may be a rigid substrate, but may also be a flexible substrate capable of bending, folding, rolling, or the like.

A light blocking layer BML may be disposed on the substrate 11. The light blocking layer BML is disposed to overlap an active layer ACT1 of a first transistor T1 of the display device 10. The light blocking layer BML may include a material blocking light, thereby preventing light from entering the active layer ACT1 of the first transistor. Further, the light blocking layer BML may be electrically connected to a source electrode S1 of the first transistor T1 through a contact hole to suppress a voltage change of the first transistor T1. For example, the light blocking layer BML may be formed of an opaque metal material that blocks light transmission, and may be formed as a Ti/Cu double layer in which a titanium layer and a copper layer are stacked. However, the present disclosure is not limited thereto, and in some cases, the light blocking layer BML may be omitted.

A buffer layer 12 may be entirely disposed on the substrate 11 and the light blocking layer BML. The buffer layer 12 may be formed on the substrate 11 to protect the first transistors T1 of the pixel PX from moisture penetrating through the substrate 11 which is vulnerable to moisture permeation, and may perform a surface planarization function. The buffer layer 12 may be formed as a plurality of inorganic layers alternately stacked. For example, the buffer layer 12 may be formed to have a multi-layer structure in which inorganic layers including at least one of silicon oxide (SiOx), silicon nitride (SiNx), and silicon oxynitride (SiOxNy) are alternately stacked.

A semiconductor layer is disposed on the buffer layer 12. The semiconductor layer may include the active layer ACT1 of the first transistor T1. The semiconductor layer and the buffer layer 12 may be disposed to partially overlap a gate electrode G1 or the like of a first gate conductive layer to be described later.

The semiconductor layer may include polycrystalline silicon, monocrystalline silicon, or oxide semiconductor. When the semiconductor layer includes an oxide semiconductor, each active layer ACT1 may include a plurality of conducting regions and a channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), or indium-gallium-zinc-tin oxide (IGZTO).

In another embodiment, the semiconductor layer may include polycrystalline silicon. Polycrystalline silicon may be formed by crystallizing amorphous silicon, and in this case, the conducting regions of the active layer ACT1 may be doped regions doped with impurities, respectively.

A first gate insulating layer 13 is disposed on the semiconductor layer (e.g., ACT1) and the buffer layer 12. The first gate insulating layer 13 may be disposed on the buffer layer 12 in addition to the semiconductor layer (e.g., ACT1). The first gate insulating layer 13 may function as a gate insulating film of each transistor. The first gate insulating layer 13 may be formed of an inorganic layer including an inorganic material, such as silicon oxide (SiOx), silicon nitride (SiNx), or silicon oxynitride (SiOxNy), or may be formed as a stacked structure of the inorganic layers.

A first gate conductive layer is disposed on the first gate insulating layer 13. The first gate conductive layer may include a gate electrode G1 of the first transistor T1. The gate electrode G1 may be disposed to overlap the channel region of the active layer ACT1 in the thickness direction. In some embodiments, the first gate conductive layer may further include a first capacitance electrode of the storage capacitor, and the above-described scan line and sensing line, and the like.

The first gate conductive layer may be formed as a single layer or multiple layer including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first interlayer insulating layer 15 is disposed on the first gate conductive layer. The first interlayer insulating layer 15 may function as an insulating film between the first gate conductive layer and other layers disposed thereon. The first interlayer insulating layer 15 may be disposed to cover the first gate conductive layer to perform a function of protecting the first gate conductive layer. The first interlayer insulating layer 15 may be formed of an inorganic layer including an inorganic material, such as silicon oxide (SiOx), silicon nitride (SiNx), or silicon oxynitride (SiOxNy), or may be formed as a stacked structure of the inorganic layers.

A first data conductive layer is disposed on the first interlayer insulating layer 15. The first data conductive layer may include a source electrode S1 and a drain electrode D1 of the first transistor T1 disposed in the display area DPA.

The source electrode S1 and drain electrode D1 of the first transistor T1 may contact the doped regions of the active layer ACT1 through respective contact holes penetrating the first interlayer insulating layer 15 and the first gate insulating layer 13, respectively. Further, the source electrode S1 of the first transistor T1 may be electrically connected to the light blocking layer BML through another contact hole penetrating the first interlayer insulating layer 15, the first gate insulating layer 13, and the buffer layer 12.

The first data conductive layer may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A second interlayer insulating layer 17 is disposed on the first data conductive layer. The second interlayer insulating layer 17 may function as an insulating film between the first data conductive layer and other layers disposed thereon. The second interlayer insulating layer 17 may be disposed to cover the first data conductive layer to perform a function of protecting the first data conductive layer. The second interlayer insulating layer 17 may be formed of an inorganic layer including an inorganic material, such as silicon oxide (SiOx), silicon nitride (SiNx), or silicon oxynitride (SiOxNy), or may be formed as a stacked structure of the inorganic layers.

A second data conductive layer is disposed on the second interlayer insulating layer 17. The second data conductive layer may include a first voltage line VL1, a second voltage line VL2, and a first conductive pattern CDP. A high-potential voltage (or a first power voltage) supplied to the first transistor T1 may be applied to first voltage line VL1, and a low-potential voltage (or a second power voltage) supplied to the second alignment electrode 22 may be applied to the second voltage line VL2. During the process of manufacturing the display device 10, an alignment signal necessary to align the light emitting elements 30 may be applied to the second voltage line VL2.

The first conductive pattern CDP may be connected to the source electrode S1 of the first transistor T1 through a contact hole formed in the second interlayer insulating layer 17. The first conductive pattern CDP may be electrically connected to the source electrodes S1, and may also be in contact with the first alignment electrode 21, which will be described later. The first transistor T1 may transfer a first power voltage applied from the first voltage line VL1 to the first alignment electrode 21 through the first conductive pattern CDP. Although it is shown in the drawings that the second data conductive layer includes one second voltage line VL2 and one first voltage line VL1, the present disclosure is not limited thereto. The second data conductive layer may include a larger number of first voltage lines VL1 and a larger number of second voltage lines VL2.

The second data conductive layer may be formed as a single layer or multiple layer including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first planarization layer 19 is disposed on the second data conductive layer. The first planarization layer 19 may perform a surface planarization function. The first planarization layer 19 may include an organic insulating material, for example, an organic material such as polyimide (PI). However, in some embodiments, the first planarization layer 19 may be omitted.

A plurality of inner banks IBNL, a plurality of outer banks EBNL, a plurality of alignment electrodes 21 and 22, a light emitting element 30, and a plurality of contact electrodes CNE1 and CNE2 may be disposed on the first planarization layer 19. Further, a plurality of insulating layers PAS1, PAS2, and PAS3 may be disposed on the first planarization layer 19.

For example, the plurality of inner banks IBNL and the plurality of outer banks EBNL may be disposed on the substrate 11. For example, the plurality of inner banks IBNL and the plurality of outer banks EBNL may be disposed on the first planarization layer 19. The plurality of inner banks IBNL and the plurality of outer banks EBNL have a shape extending in the second direction DR2 within each sub-pixel PXn, but may be disposed not to extend to another adjacent sub-pixel PXn in the second direction DR2. For example, the plurality of inner banks IBNL may be disposed in the light emission area EMA of each sub-pixel PXn such that the lengths thereof extending in the second direction DR2 do not exceed the cut area CBA and the other sub-pixel PXn, and are smaller than the length of light emission area EMA.

The plurality of inner banks IBNL may be spaced from each other in the first direction DR1, and may have widths (e.g., set or predetermined widths) in the first direction DR1. The plurality of inner banks IBNL may be disposed in an island shape. Two inner banks IBNL may be disposed in one sub-pixel PXn, and may be spaced from each other, thereby providing light emitting elements 30 therebetween.

Although it is illustrated in the drawings that two inner banks IBNL are disposed in one sub-pixel PXn, the present disclosure is not limited thereto. A larger number of inner banks IBNL may be further disposed depending on the number of alignment electrodes 21 and 22 to be described later. Further, the shape of the inner banks IBNL is not limited thereto, and the inner banks IBNL may be arranged to occupy a smaller area or a larger area in each sub-pixel PXn.

The plurality of inner banks IBNL may have a structure in which at least a part thereof protrudes from the upper surface of the first planarization layer 19. The protrusion portions of the plurality of inner banks IBNL may have an inclined side surface, and the light emitted from the light emitting element 30 may be reflected from the alignment electrodes 21 and 22 disposed on the plurality of inner banks IBNL and emitted in the upward direction of the planarization layer 19. The plurality of inner banks IBNL may provide an area in which the light emitting element 30 is disposed, and at the same time, may function as a reflective barrier that reflects light emitted from the light emitting element 30 in an upward direction. The side surface of the plurality of inner banks IBNL may be inclined in a linear shape, but is not limited thereto, and the plurality of inner banks IBNL may have a curved semi-circle or semi-ellipse shape. The plurality of inner banks IBNL may include an organic insulating material such as polyimide (PI), but the material thereof is not limited thereto.

The plurality of outer banks EBNL may be disposed on the first planarization layer 19. For example, the plurality of outer banks EBNL may be disposed to be in contact with the first planarization layer 19 and may be disposed at the same layer as the plurality of inner banks IBNL. The plurality of outer banks EBNL may be disposed to surround (or disposed around) the light emission area EMA in which the light emitting elements 30 are disposed and the cut area CBA, to partition them respectively. Because the plurality of outer banks EBNL are disposed to extend in the second direction DR2, they may have a line shape that extends continuously over the entire surface of the display area DPA of the substrate 11. For example, the plurality of outer banks EBNL may be formed in a stripe pattern extending in the second direction.

The plurality of outer banks EBNL may separate the different light emitting elements 30 dispersed in the ink such that they are not mixed with each other for each sub-pixel PXn. For example, the outer banks EBNL may separate the different light emitting elements 30 dispersed in the ink in each sub-pixel PXn such that they do not mix with the light emitting elements 30 dispersed in the ink in a neighboring sub-pixel PXn. Side surfaces of the plurality of outer banks EBNL may be inclined in a linear shape, but the present disclosure is not limited thereto, and the plurality of outer banks EBNL may have a shape of a semicircle or semi-ellipse with a curved outer surface. In an embodiment, like the aforementioned plurality of inner banks, the plurality of outer banks EBNL may include an organic insulating material such as polyimide (PI), but the material thereof is not limited thereto.

Referring to FIG. 7, in an embodiment, the plurality of outer banks EBNL may include a first outer bank EBNL1 and a second outer bank EBNL2. The first outer bank EBNL1 and the second outer bank EBNL2 may divide the plurality of pixels PXn arranged along the second direction DR2, and may divide the cut area CBA and light emission area EMA of each pixel PX1.

The first outer bank EBNL1 and the second outer bank EBNL2 may be disposed adjacent to each other while facing (or opposite to) each other. The first outer bank EBNL1 and the second outer bank EBNL2 may be disposed to be spaced from each other with the plurality of inner banks IBNL interposed therebetween. The first outer bank EBNL1 may include a first linear portion LA1 parallel to the inner banks IBNL, and a plurality of protrusion portions PR1, PR2, and PR3 protruding from the first linear portion LA1 in the first direction DR1. The plurality of protrusion portions PR1, PR2, and PR3 may protrude toward the inner banks IBNL. Similarly, the second outer bank EBNL2 may include a second linear portion LA2 parallel to the inner banks IBNL, and a plurality of protrusion portions PR4, PR5, and PR6 protruding from the second linear portion LA2 toward the first outer bank EBNL1. The plurality of protrusion portions PR4, PR5, and PR6 may protrude toward the inner banks IBNL.

The plurality of protrusion portions PR1, PR2, and PR3 of the first outer bank EBNL1 may be disposed to face the plurality of protrusion portions PR4, PR5, and PR6 of the second outer bank EBNL2, respectively. The plurality of protrusion portions PR1, PR2, and PR3 of the first outer bank EBNL1 may include a first protrusion portion PR1, a second protrusion portion PR2, and a third protrusion portion PR3 which are spaced from each other. The plurality of protrusion portions PR4, PR5, and PR6 of the second outer bank EBNL2 may include a fourth protrusion portion PR4, a fifth protrusion portion PR5, and a sixth protrusion portion PR6 which are spaced from each other. The first protrusion portion PR1 may be disposed to face the fourth protrusion portion PR4 and may be disposed along the same horizontal line (e.g., an imaginary line). The second protrusion portion PR2 may be disposed to face the fifth protrusion portion PR5 and may be disposed along the same horizontal line (e.g., an imaginary line). The third protrusion portion PR3 may be disposed to face the sixth protrusion portion PR6 and may be disposed along the same horizontal line (e.g., an imaginary line). In FIG. 7, the imaginary lines may appear as horizontal; lines, however orientation of the imaginary lines would depend on the orientations of the device.

The plurality of protrusion portions PR1, PR2, and PR3 of the first outer bank EBNL1 may be arranged to be spaced from the plurality of protrusion portions PR4, PR5, and PR6 of the second outer bank EBNL2 by suitable distances (e.g., set or predetermined distances).

The first distance W1 between the first protrusion portion PR1 and the fourth protrusion portion PR4 may be the same (or substantially the same) as the second distance W2 between the second protrusion portion PR2 and the fifth protrusion portion PR5 and the third distance W3 between the third protrusion portion PR3 and the sixth protrusion portion PR6.

In an embodiment, the plurality of outer banks EBNL1 and EBNL2 may be arranged to extend in the second direction DR2 and spaced from each other in the first direction DR1, so that when ink including the light emitting elements 30 is sprayed in a sub-pixel PXn, the ink may be induced to spread along the outer banks EBNL1 and EBNL2, so that the ink may be prevented from overflowing to the adjacent sub-pixel PXn. In other words, the ink is spread between the plurality of protrusion portions PR1, PR2, and PR3 of the first outer bank EBNL1 and the plurality of protrusion portions PR4, PR5, and PR6 of the second outer bank EBNL2 in the second direction DR2 to prevent the ink from overflowing to the adjacent sub-pixel PXn in the first direction DR1.

Further, the distances W1, W2, and W3 between the plurality of protrusion portions PR1, PR2, and PR3 of the first outer bank EBNL1 and the plurality of protrusion portions PR4, PR5, and PR6 of the second outer bank EBNL2, respectively, may be greater than the distances between the plurality of adjacent inner banks IBNL, respectively. For example, the plurality of inner banks IBNL may include a first inner bank IBNL1 and a second inner bank IBNL2. Here, each of the distances W1, W2, and W3 between the plurality of protrusion portions PR1, PR2, and PR3 of the first outer bank EBNL1 and the plurality of protrusion portions PR4, PR5, and PR6 of the second outer bank EBNL2, respectively, may be greater than the distance W4 from one side of the first inner bank IBNL1 to the other side of the second inner bank IBNL2. Accordingly, the ink including the light emitting elements 30 may easily spread through the distances between the protrusion portions along the second direction DR2. That is, the ink may easily spread through the second distance W2 between the second protrusion portion PR2 and the fifth protrusion portion PR5 and the third distance W3 between the third protrusion portion PR3 and the sixth protrusion portion PR6.

Because the distance W5 between the first linear portion LA1 of the first outer bank EBNL1 and the second linear portion LA2 of the second outer bank EBNL2 is the same as each other at any point, the light emission areas EMA of each pixel PXn (or each sub pixel PXn) may be formed to have the same area. However, the present disclosure is not limited thereto, and in the cut area CBA, the distance W5 between the first linear portion LA1 of the first outer bank EBNL1 and the second linear portion LA2 of the second outer bank EBNL2 may be narrower than the distance of the light emission area EMA.

As shown in FIG. 8, in an embodiment, the distances between the plurality of protrusion portions PR1, PR2, PR3 of the first outer bank EBNL1 and the plurality of protrusion portions PR4, PR5, PR6 of the second outer bank EBNL2 may be different from each other. For example, the distances between the plurality of protrusion portions PR1, PR2, PR3 of the first outer bank EBNL1 and the plurality of protrusion portions PR4, PR5, PR6 of the second outer bank EBNL2 may gradually increase. That is, the first distance W1 between the first protrusion portion PR1 and fourth protrusion portion PR4 may be smaller than the second distance W2 between the second protrusion portion PR2 and the fifth protrusion portion PR5, and the second distance W2 between the second protrusion portion PR2 and the fifth protrusion portion PR5 may be smaller than the third distance W3 between the third protrusion portion PR3 and the sixth protrusion portion PR6. However, the present disclosure is not is limited thereto, and the distances between the plurality of protrusion portions PR1, PR2, PR3 of the first outer bank EBNL1 and the plurality of protrusion portions PR4, PR5, PR6 of the second outer bank EBNL2, respectively, may gradually decrease.

In an embodiment, in the case where the distances between the plurality of protrusion portions PR1, PR2, PR3 of the first outer bank EBNL1 and the plurality of protrusion portions PR4, PR5, PR6 of the second outer bank EBNL2, respectively, gradually decrease, when the ink containing the light emitting elements 30 is sprayed, the distances between the protrusions becomes narrow, resulting in a capillary phenomenon, and thus the ink may spread faster. Accordingly, it is possible to induce the ink to spread faster in the second direction DR2 to prevent the ink from overflowing to the adjacent pixel in the first direction DR1.

In some embodiments, the heights of the plurality of outer banks EBNL may be the same as the heights of the plurality of inner banks IBNL. In each of the plurality of outer banks EBNL, the heights of the linear portions LA1 and LA2 may be the same as the heights of the protrusion portions PR1, PR2, PR3, PR4, PR5, and PR6. For example, the height of the first linear portion LA1 of the first outer bank EBNL1 may be the same as the height of each of the first to third protrusion portions PR1, PR2, and PR3. Similarly, the height of the second linear portion LA2 of the second outer bank EBNL2 may also be the same as the height of the first linear portion LA1 of the first outer bank EBNL1, and may be the same as the height of each of the fourth to sixth protrusion portions PR4, PR5, and PR6.

In another embodiment, in each of the plurality of outer banks EBNL, the heights of the linear portions LA1 and LA2 may be different from the heights of the protrusion portions PR1, PR2, PR3, PR4, PR5, and PR6. For example, the heights of the linear portions LA1 and LA2 may be higher than the heights of the protrusion portions PR1, PR2, PR3, PR4, PR5, and PR6. Because the linear portions LA1 and LA2 serve to prevent the ink including the light emitting elements 30 from overflowing to the adjacent pixel, it is desirable that the linear portions LA1 and LA2 have high heights. In contrast, because the protrusion portions PR1, PR2, PR3, PR4, PR5, and PR6 serve to divide the light emission area EMA and the cut area CBA, they do not need relatively high heights and may be formed to have low heights compared to the linear portions LA1 and LA2 such that the ink easily spread.

Referring to FIGS. 4 and 5, the plurality of alignment electrodes 21 and 22 are arranged on the plurality of inner banks IBNL and the first planarization layer 19. The plurality of alignment electrodes 21 and 22 may include a first alignment electrode 21 and a second alignment electrode 22. The first alignment electrode 21 and the second alignment electrode 22 may extend in the second direction DR2, and may be disposed to be spaced from each other in the first direction DR1.

Each of the first alignment electrode 21 and the second alignment electrode 22 may extend in the second direction DR2 within the sub-pixel PXn, and may be separated from other alignment electrodes 21 and 22 of an adjacent sub-pixel in the second direction DR2 in the cut area CBA. For example, the cut area CBA may be disposed between the light emission areas EMA of the sub-pixels PXn neighboring in the second direction DR2, and the first alignment electrode 21 and the second alignment electrode 22 may be separated in the cut area CBA from other first and second alignment electrodes 21 and 22 disposed in the sub-pixels PXn neighboring in the second direction DR2. However, the present disclosure is not limited thereto, and some of the alignment electrodes 21 and 22 may be disposed to extend beyond the sub-pixels PXn neighboring in the second direction DR2 without being separated from each other for each pixel PXn, or only one of the first alignment electrode 21 and the second alignment electrode 22 may be separated.

The first alignment electrode 21 may be electrically connected to the first transistor T1 through a first contact hole CT1, and the second alignment electrode 22 may be electrically connected to the second voltage line VL2 through a second contact hole CT2. For example, the first alignment electrode 21 may contact the first conductive pattern CDP through the first contact hole CT1 penetrating the first planarization layer 19 in the portion extending in the first direction DR1 from the inner bank IBNL. The second alignment electrode 22 may also contact the second voltage line VL2 through the second contact hole CT2 penetrating the first planarization layer 19 in the portion extending in the first direction DR1 from the inner bank IBNL. However, the present disclosure is not limited thereto. In another embodiment, the first contact hole CT1 and the second contact hole CT2 may overlap the inner bank IBNL.

Referring to FIGS. 2 and 7, the first contact hole CT1 of the first alignment electrode 21 and the second contact hole CT2 of the second alignment electrode 22 may be disposed between the outer banks EBNL. For example, the first contact hole CT1 of the first alignment electrode 21 and the second contact hole CT2 of the second alignment electrode 22 may be disposed between the second protrusion portion PR2 of the first outer bank EBNL1 and the fifth protrusion portion PR5 of the second outer bank EBNL2. However, the present disclosure is not limited thereto, and the first contact hole CT1 of the first alignment electrode 21 and the second contact hole CT2 of the second alignment electrode 22 may be disposed in the light emission area EMA or the cut area CBA between the outer banks EBNL.

The first alignment electrode 21 and the second alignment electrode 22 may extend between the outer banks EBNL in the second direction DR2 in which the outer bank EBNL extends. The first alignment electrode 21 and the second alignment electrode 22 may be disposed between the protrusion portions PR1, PR2, PR3 of the first outer bank EBNL1 and the protrusion portions PR4, PR5, PR6 of the second outer bank EBNL2. The first alignment electrode 21 and the second alignment electrode 22 may be disposed not to overlap the outer bank EBNL, and may be disposed to be spaced from the protrusion portions PR1, PR2, PR3 of the first outer bank EBNL1 and the protrusion portions PR4, PR5, PR6 of the second outer bank EBNL2 by suitable distances (e.g., set or predetermined distances).

Although it is illustrated in the drawings that one first alignment electrode 21 and one second alignment electrode 22 are disposed for each sub-pixel PXn, the present disclosure is not limited thereto, and the number of first alignment electrodes 21 and second alignment electrodes 22 disposed for each sub-pixel PXn may be greater. The first alignment electrode 21 and the second alignment electrode 22 disposed in each sub-pixel PXn may not necessarily have a shape extending in one direction, and the first alignment electrode 21 and the second alignment electrode 22 may be disposed in various structures. For example, the first alignment electrode 21 and the second alignment electrode 22 may have a partially curved or bent shape, and one electrode may be arranged to surround (or be around) the other electrode.

Each of the first alignment electrode 21 and the second alignment electrode 22 may be directly disposed on the inner banks IBNL. Each of the first alignment electrode 21 and the second alignment electrode 22 may be formed to have a larger width than the inner bank IBNL. For example, each of the first alignment electrode 21 and the second alignment electrode 22 may be disposed to completely cover the inner bank IBNL. The interval between the first alignment electrode 21 and the second alignment electrode 22 may be narrower than the interval between the inner banks IBNL. At least a part of the first alignment electrode 21 and at least a part of the second alignment electrode 22 are directly disposed on the first planarization layer 19, so that the first alignment electrode 21 and the second alignment electrode 22 may be disposed at the same plane. However, the present disclosure is not limited thereto. In some cases, each of the alignment electrodes 21 and 22 may have a width smaller than that of the inner bank IBNL.

Each of the alignment electrodes 21 and 22 may include a conductive material having high reflectance. For example, each of the alignment electrodes 21 and 22 may include a metal such as silver (Ag), copper (Cu), or aluminum (Al) as the conductive material having high reflectance, or may include an alloy containing aluminum (Al), nickel (Ni), or lanthanum (La). Each of the alignment electrodes 21 and 22 may reflect the light emitted from the light emitting element 30 and proceeding to the side surface of the inner bank IBNL in the upward direction of each sub-pixel PXn.

However, the present disclosure is not limited thereto, and each of the alignment electrodes 21 and 22 may further include a transparent conductive material. For example, each of the alignment electrodes 21 and 22 may include a material such as indium tin oxide (ITO), indium zinc oxide (IZO), or indium tin zinc Oxide (ITZO). In some embodiments, each of the alignment electrodes 21 and 22 may have a structure in which one or more transparent conductive material layers and one or more metal layers having high reflectivity are stacked, or may be formed as one layer including them. For example, each of the alignment electrodes 21 and 22 may have a stacked structure of ITO/Ag/ITO/, ITO/Ag/IZO, or ITO/Ag/ITZO/IZO.

The plurality of alignment electrodes 21 and 22 may be electrically connected to the light emitting elements 30, and a voltage (e.g., a set or predetermined voltage) may be applied to the alignment electrodes 21 and 22 such that the light emitting elements 30 emit light. The plurality of alignment electrodes 21 and 22 may be electrically connected to the light emitting elements 30 through the contact electrodes CNE1 and CNE2, and may transmit electrical signals applied to the electrodes 21 and 22 to the light emitting elements 30 through the contact electrodes CNE1 and CNE2.

One of the first alignment electrode 21 and the second alignment electrode 22 may be electrically connected to an anode electrode of the light emitting element 30, and the other one thereof may be electrically connected to a cathode electrode of the light emitting element 30. However, the present disclosure is not limited thereto, and vice versa.

Each of the alignment electrodes 21 and 22 may be used to form an electric field in the sub-pixel PXn to align the light emitting element 30. The light emitting element 30 may be disposed between the first alignment electrode 21 and the second alignment electrode 22 by an electric field formed between the first alignment electrode 21 and the second alignment electrode 22. The light emitting elements 30 of the display device 10 may be sprayed on the alignment electrodes 21 and 22 through an inkjet printing process. When an ink including the light emitting elements 30 is sprayed on the alignment electrodes 21 and 22, an alignment signal is applied to the alignment electrodes 21 and 22 to form an electric field. The light emitting elements 30 dispersed in the ink may be aligned between the alignment electrodes 21 and 22 by receiving an electrophoretic force by the electric field formed between the alignment electrodes 21 and 22.

A first insulating layer PAS1 is disposed on the first planarization layer 19. The first insulating layer PAS1 may be disposed to cover the inner banks IBNL, the outer banks EBNL, the first alignment electrode 21, and the second alignment electrode 22. The first insulating layer PAS1 may protect the first alignment electrode 21 and the second alignment electrode 22 and insulate them from each other. Further, the first insulating layer PAS1 may prevent the light emitting elements 30 disposed thereon from being damaged by direct contact with other members.

The first insulating layer PAS1 may expose at least a part of each of the first and second alignment electrodes 21 and 22. The first insulating layer PAS1 may cover one end of the first alignment electrode 21 and one end of the second alignment electrode 22. The first insulating layer PAS1 may expose the other end of the first alignment electrode 21 and the other end of the second alignment electrode 22. The other end of the first alignment electrode 21 and the other end of the second alignment electrode 22, which are exposed, may contact the first contact electrode CNE1 and the second contact electrode CNE2 to be described later.

The first insulating layer PAS1 may expose at least a part of the first planarization layer 19 not to overlap the first planarization layer 19. The first planarization layer 19 exposed by the first insulating layer PAS1 is subjected to hydrophobic treatment to prevent the ink including the light emitting elements 30 from overflowing to the adjacent pixel.

The first insulating layer PAS1 may overlap the inner banks IBNL and the light emitting element 30 in the light emission area EMA to extend in the second direction DR2.

At least a part of the first insulating layer PAS1 may be disposed so as not to cover the cut area CBA adjacent to the light emission area EMA, so that the first alignment electrode 21 and the second alignment electrode 22 are shorted in the cut area CBA. Further, another part of the first insulating layer PAS1 may be disposed to extend in the second direction DR2 while covering the outer bank EBNL. The first insulating layers PAS1 may be disposed in an island-shaped pattern.

The light emitting element 30 may be disposed between the first alignment electrode 21 and the second alignment electrode 22 on the first insulating layer PAS1. In an embodiment, the light emitting element 30 may have a shape extending in one direction, and the plurality of light emitting elements 30 may be spaced from each other, and may be aligned substantially in parallel to each other. The intervals between the light emitting elements 30 are not particularly limited. In some cases, the plurality of light emitting elements 30 are arranged adjacent to each other to form a group, and the plurality of other light emitting elements 30 may form a group in a state spaced from each other at suitable intervals (e.g., set or predetermined intervals) and may be arranged with non-uniform density. The direction in which each of the alignment electrodes 21 and 22 extends may be substantially perpendicular to the direction in which the light emitting element 30 extends. However, the present disclosure is not limited thereto, and the light emitting element 30 may be disposed obliquely at an angle (e.g., a set or predetermined angle) without being perpendicular to the direction in which each of the alignment electrodes 21 and 22 extends.

The light emitting elements 30 disposed in each sub-pixel PXn may include light emitting layers ('36' in FIG. 9) containing different materials to emit light of different wavelengths to the outside. Accordingly, light of the first color, light of the second color, and light of the third color may be emitted from the first sub-pixel PX1, the second sub-pixel PX2, and the third sub-pixel PX3, respectively. However, the present disclosure is not limited thereto, and each of the sub-pixels PXn includes the same type of light emitting elements 30 to emit light of substantially the same color.

The light emitting element 30 may be disposed on the first insulating layer PAS1 between the alignment electrodes 21 and 22. For example, at least one end of the light emitting element 30 may be disposed on the first alignment electrode 21 or the second alignment electrode 22. As shown in the drawings, the extending length of the light emitting element 30 may be longer than the interval between the first alignment electrode 21 and the second alignment electrode 22, and both ends of the light emitting element 30 may be disposed on the first alignment electrode 21 and the second alignment electrode 22, respectively. However, the present disclosure is not limited thereto, and any one end of the light emitting element 30 may be disposed on each of the alignment electrodes 21 and 22, or both ends thereof may not be arranged on the alignment electrodes 21 and 22, respectively. Even if the light emitting element 30 is not disposed on the alignment electrodes 21 and 22, both ends of the light emitting element 30 may be electrically connected to the alignment electrodes 21 and 22 through contact electrodes CNE1 and CNE2 to be described later.

The light emitting element 30 may be provided with a plurality of layers in a direction perpendicular to the upper surface of the substrate 11 or the first planarization layer 19. According to an embodiment, the light-emitting element 30 may have a shape extending in one direction and have a structure in which a plurality of semiconductor layers are sequentially arranged in one direction.

The light emitting element 30 of the display device 10 is disposed such that one extending direction is parallel to the upper surface of the first planarization layer 19, and the plurality of semiconductor layers included in the light emitting element 30 may be sequentially arranged along a direction parallel to the upper surface of the first planarization layer 19. However, the present disclosure is not limited thereto. In some cases, when the light emitting element 30 has a different structure, the plurality of semiconductor layers may be arranged in a direction perpendicular to the first planarization layer 19.

Both ends of the light emitting element 30 may contact the contact electrodes CNE1 and CNE2, respectively. According to an embodiment, the light emitting element 30 may not be provided with an insulating film ('38' in FIG. 9) on the end surface in one direction, and a part of the semiconductor layer and a part of the electrode layer may be exposed, and thus the exposed semiconductor layer and electrode layer may contact the contact electrodes CNE1 and CNE2. However, the present disclosure is not limited thereto. In some cases, in the light emitting element, at least a part of the insulating film 38 may be removed, so that both side surfaces of the semiconductor layer and the electrode layer may be partially exposed. The exposed side surfaces of the semiconductor layer and the electrode layer may directly contact the contact electrodes CNE1 and CNE2.

A second insulating layer PAS2 may be partially disposed on the light emitting element 30 between the first alignment electrode 21 and the second alignment electrode 22. The second insulating layer PAS2 may be disposed to partially surround the outer surface of the light emitting element 30. A part of the second insulating layer PAS2 disposed on the light emitting element 30 has a shape extending in the second direction DR2 between the first alignment electrode 21 and the second alignment electrode 22 in a plan view. For example, the second insulating layer PAS2 may form a linear or island-shaped pattern in each sub-pixel PXn.

The second insulating layer PAS2 may be disposed on the light emitting element 30, but may expose one end and the other end of the light emitting element 30. The exposed ends of the light emitting element 30 may be in contact with the contact electrodes CNE1 and CNE2 to be described later. The shape of the second insulating layer PAS2 may be formed by a patterning process using a material forming the second insulating layer 52 using a conventional mask process. The mask for forming the second insulating layer PAS2 may have a width narrower than the length of the light emitting element 30, and the material constituting the second insulating layer PAS2 may be patterned to expose both ends of the light emitting element 30. However, the present disclosure is not limited thereto.

The second insulating layer PAS2 may protect the light emitting element 30 and concurrently perform (or simultaneously perform) a function of fixing the light emitting element 30 in the process of manufacturing the display device 10. Further, in an embodiment, a part of the material of the second insulating layer PAS2 may be disposed between the lower surface of the light emitting element 30 and the first insulating layer PAS1. As described above, the second insulating layer PAS2 may be formed to fill the space between the first insulating layer PAS1 formed during the process of manufacturing the display device 10 and the light emitting element 30. Accordingly, the second insulating layer PAS2 may be disposed so as to surround the outer surface of the light emitting element 30 to protect the light emitting element 30 and concurrently fix (e.g., simultaneously fix) the light emitting element 30 during the process of manufacturing the display device 10.

A plurality of contact electrodes CNE1 and CNE2 and a third insulating layer PAS3 may be disposed on the second insulating layer PAS2.

The plurality of contact electrodes CNE1 and CNE2 may have a shape extending in one direction, and may be disposed on each of the alignment electrodes 21 and 22. The contact electrodes CNE1 and CNE2 may include a first contact electrode CNE1 disposed on the first alignment electrode 21 and a second contact electrode CNE2 disposed on the second alignment electrode 22. The contact electrodes CNE1 and CNE2 may be disposed to be spaced from each other and face each other. For example, the first contact electrode CNE1 and the second contact electrode CNE2 may be disposed on the first alignment electrode 21 and the second alignment electrode 22, respectively, and may be spaced from each other in the first direction DR1. Each of the contact electrodes CNE1 and CNE2 may form a stripe pattern in the light emission area EMA of each sub-pixel PXn.

Each of the plurality of contact electrodes CNE1 and CNE2 may contact the light emitting element 30. The first contact electrode CNE1 may contact one end of the light emitting element 30, and the second contact electrode CNE2 may contact the other end of the light emitting element 30. In the light emitting element 30, a semiconductor layer is exposed on both end surfaces in an extending direction, and the contact electrodes CNE1 and CNE2 may be in electrical contact with the semiconductor layer and electrode layer of the light emitting element 30. One side of each of the contact electrodes CNE1 and CNE2 in contact with both ends of the light emitting element 30 may be disposed on the second insulating layer PAS2. The first contact electrode CNE1 may contact the first alignment electrode 21 through an opening OP exposing a part of the upper surface of the first alignment electrode 21, and the second contact electrode CNE2 may contact the second alignment electrode 22 through an opening OP exposing a part of the upper surface of the second alignment electrode 22.

The width of each of the contact electrodes CNE1 and CNE2 measured in one direction may be smaller than the width of each of the alignment electrodes 21 and 22 measured in the one direction. Each of the contact electrodes CNE1 and CNE2 may be disposed to contact one end and the other end of the light emitting element 30 and cover a part of the upper surface of each of the first alignment electrode 21 and the second alignment electrode 22. However, the present disclosure is not limited thereto, and the contact electrodes CNE1 and CNE2 may be formed to have larger widths than the alignment electrodes 21 and 22 to cover both sides of the alignment electrodes 21 and 22.

The contact electrodes CNE1 and CNE2 may include a transparent conductive material. For example, the contact electrodes CNE1 and CNE2 may include ITO, IZO, ITZO, or aluminum (Al). The light emitted from the light emitting element 30 may pass through the contact electrodes CNE1 and CNE2 and proceed toward the alignment electrodes 21 and 22. However, the present disclosure is not limited thereto.

Although it is shown in the drawings that two contact electrodes CNE1 and CNE2 are disposed in one sub-pixel PXn, the present disclosure is not limited thereto. The number of contact electrodes CNE1 and CNE2 may be changed depending on the number of alignment electrodes 21 and 22 disposed for each sub-pixel PXn.

The third insulating layer PAS3 is disposed to cover the first contact electrode CNE1. The third insulating layer PAS3 may be disposed to cover the first contact electrode CNE1 and may include a portion disposed between the first contact electrode CNE1 and the second contact electrode CNE2 on the light emitting element 30. In other words, the third insulating layer PAS3 may cover one side of the second insulating layer PAS2 at which the first contact electrode CNE1 is located, and may cover the first contact electrode CNE1. For example, the third insulating layer PAS3 may be disposed to cover the first contact electrode CNE1 and the first alignment electrode 21. Such an arrangement may be formed by a process of partially removing an insulating material layer to form the second contact electrode CNE2 after entirely placing the insulating material layer forming the third insulating layer PAS3 in the light emission area EMA. In the above process, the insulating material layer forming the third insulating layer PAS3 may be removed together with the insulating material layer forming the second insulating layer PAS2, and one side of the third insulating layer PAS3 may be aligned with one side of the second insulating layer PAS2. One side of the second contact electrode CNE2 may be disposed on the third insulating layer PAS3, and the second contact electrode CNE2 may be insulated from the first contact electrode CNE1 with the third insulating layer PAS3 therebetween.

Each of the above-described first insulating layer PAS1, second insulating layer PAS2, and third insulating layer PAS3 may include an inorganic insulating material or an organic insulating material. For example, each of the first insulating layer PAS1, the second insulating layer PAS2, and the third insulating layer PAS3 may include an inorganic insulating layer such as silicon oxide (SiOx), silicon nitride (SiNx), silicon oxynitride (SiOxNy), aluminum oxide ($Al_2O_3$), or aluminum nitride (AlN). Alternatively, each of the first insulating layer PAS1, the second insulating layer PAS2, and the third insulating layer PAS3 may include an organic insulating layer such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the present disclosure is not limited thereto.

Figure 9:
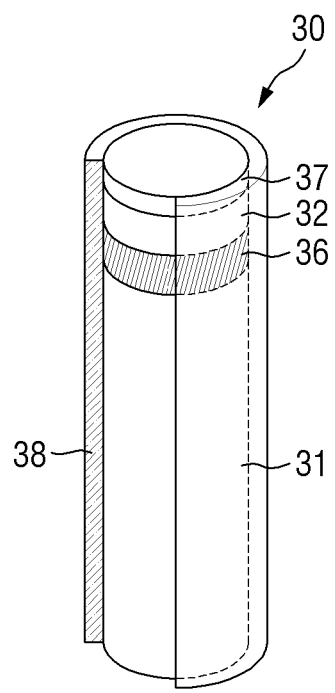
FIG. 9 is a schematic cutaway view of a light emitting element according to an embodiment.

FIG. 9 is a schematic cutaway view of a light emitting element according to an embodiment.

Referring to FIG. 9, the light emitting element 30 is a particulate element, and may have a rod or cylindrical shape having an aspect ratio (e.g., a set or predetermined aspect ratio). The light emitting element 30 may have a size of a nanometer scale (1 nm or more and less than 1 μm) to a micrometer scale (1 μm or more and less than 1 mm). In an embodiment, the light emitting element 30 may have a size of a nanometer scale in both diameter and length, or may have a size of a micrometer scale in both diameter and length. In some embodiments, the light emitting element 30 may have a size of a nanometer scale in diameter, whereas may have a size of a micrometer scale in length. In some embodiments, some light emitting elements 30 may have a size of a nanometer scale in diameter and/or length, whereas other light emitting elements 30 may have a size of a micrometer scale in diameter and/or length.

In an embodiment, the light emitting element 30 may be an inorganic light emitting diode. For example, the light emitting element 30 may include semiconductor layers doped with any conductive type (for example, p-type or n-type) impurity. The semiconductor layers may receive an electrical signal applied from an external power source and emit light of a specific wavelength band.

The light emitting element 30 according to an embodiment may include a first semiconductor layer 31, a light emitting layer 36, a second semiconductor layer 32, and an electrode layer 37, which are sequentially stacked along the length direction. The light emitting element 30 may further include an insulating film 38 surrounding the outer surfaces (e.g., outer peripheral surfaces) of the first semiconductor layer 31, the second semiconductor layer 32, and the light emitting layer 36.

The first semiconductor layer 31 may be an n-type semiconductor layer. When the light emitting element 30 emits light of a blue wavelength band, the first semiconductor layer 31 may include a semiconductor material having a composition ratio of $Al_xGa_yIn_{1-x-y}N$ (here, $0 \leq x \leq 1$, $0 \leq y0 \leq 1$, $0 \leq x+y \leq 1$). For example, the semiconductor material may be at least one of AlGaInN, GaN, AlGaN, InGaN, AlN, and InN, each being doped with n-type impurities. The first semiconductor layer 31 may be doped with an n-type dopant. The n-type dopant may be Si, Ge, or Sn. For example, the first semiconductor layer 31 may be n-GaN doped with n-type Si. The length of the first semiconductor layer 31 may have a range of 1.5 µm to 5 µm, but is not limited thereto.

The second semiconductor layer 32 is disposed on the light emitting layer 36 to be described later. The second semiconductor layer 32 may be a p-type semiconductor layer. When the light emitting element 30 emits light of a blue wavelength band or a green wavelength band, the second semiconductor layer 32 may include a semiconductor material having a composition ratio of $Al_xGa_yIn_{1-x-y}N$ (here, $0 \leq x \leq 1$, $0 \leq y0 \leq 1$, $0 \leq x+y \leq 1$). For example, the semiconductor material may be at least one of AlGaInN, GaN, AlGaN, InGaN, AlN, and InN, each being doped with p-type impurities. The second semiconductor layer 32 may be doped with a p-type dopant. The p-type dopant may be Mg, Zn, Ca, Se, or Ba. For example, the second semiconductor layer 32 may be p-GaN doped with p-type Mg. The length of the second semiconductor layer 32 may have a range of 0.05 µm to 0.10 µm, but is not limited thereto.

Although it is shown in FIG. 4 that each of the first semiconductor layer 31 and the second semiconductor layer 32 is formed as one layer, the present disclosure is not limited thereto. Each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 is disposed between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. When the light emitting layer 36 emits light of a blue wavelength band, the light emitting layer 36 may include a material such as AlGaN or AlGaInN. For example, when the light emitting layer 36 has a multiple quantum well structure in which quantum layers and well layers are alternately stacked, the quantum wells may include a material such as AlGaN or AlGaInN, and the well layers may include a material such as GaN or AlInN. For example, the light emitting layer 36 includes quantum wells each containing AlGaInN and well layers each containing AlInN, and thus the light emitting layer 36 may emit blue light having a central wavelength band of 450 nm to 495 nm as described above.

However, the present disclosure is not limited thereto, and the light emitting layer 36 may have a structure in which semiconductor materials having high bandgap energy and semiconductor materials having low bandgap energy are alternately stacked, and may include other Group Ill to Group V semiconductor materials depending on the wavelength bad of light. The light emitted from the light emitting layer 36 is not limited to light of a blue wavelength band, and in some cases, the light emitting layer 36 may emit light of a red or green wavelength band. The length of the light emitting layer 36 may have a range of 0.05 µM to 0.10 µM, but is not limited thereto.

In some embodiments, the light emitted from the light emitting layer 36 may be emitted to both side surfaces of the light emitting element 30 as well as the longitudinal outer surface of the light emitting element 30. The direction of the light emitted from the light emitting layer 36 is not limited to one direction.

The electrode layer 37 may be an ohmic contact electrode. However, the present disclosure is not limited thereto, and the electrode layer 37 may be a Schottky contact electrode. The light emitting element 30 may include at least one electrode layer 37. Although it is shown in FIG. 9 that the light emitting element 30 includes one electrode layer 37, the present disclosure is not limited thereto. In some cases, the light emitting element 30 may include a larger number of electrode layers 37, or the electrode layer 37 may be omitted. A description of the light emitting element 30 to be described later may be equally applied even if the number of electrode layers 37 is changed or the light emitting element 30 further includes other structures.

When the light emitting element 30 is electrically connected to an electrode or a contact electrode in the display device 10 according to an embodiment, the electrode layer 37 may reduce resistance between the light emitting element 30 and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. The electrode layer 37 may include the same material, and may include different materials from each other, but the present disclosure is not limited thereto.

The insulating film 38 is disposed to surround the outer surfaces (e.g., outer peripheral surfaces) of the above-described semiconductor layers and electrode layers. For example, the insulating film 38 may be disposed to surround at least the outer surface (e.g., an outer peripheral surface) of the light emitting layer 36, and may extend in one direction (e.g., a length direction) in which the light emitting element 30 extends. The insulating film 38 may function to protect the members. For example, the insulating film 38 may be formed to surround the side surfaces of the members, and may be formed such that both ends of the light emitting element 30 in a length direction are exposed.

Although it is shown in FIG. 9 that the insulating film 38 may extend in the length direction of the light emitting element 30 to cover the first semiconductor layer 31 to the side surface of the electrode layer 37, the present disclosure is not limited thereto. The insulating film 38 may cover only the outer surface (e.g., an outer peripheral surface) of a part of the semiconductor layer as well as the light emitting layer 36 or cover only a part of the outer surface (e.g., an outer peripheral surface) of the electrode layer 37 to partially expose the outer surface (e.g., an outer peripheral surface) of the electrode layer 37. The insulating film 38 may be formed to have a rounded cross-sectional upper surface in an area adjacent to at least one end of the light emitting element 30.

The thickness of the insulating film 38 may have a range of 10 nm to 1.0 μm, but is not limited thereto. Preferably, the thickness of the insulating film 38 may be about 40 nm.

The insulating film 38 may include a material having insulating properties, for example, silicon oxide (SiOx), silicon nitride (SiNx), silicon oxynitride (SiOxNy), aluminum nitride (AlN), or aluminum oxide ($Al_2O_3$). Although it is illustrated in FIG. 9 that the insulating film 38 is formed as a single layer, the present disclosure is not limited thereto. In some embodiments, the insulating film 38 may be formed to have a multi-layer structure in which a plurality of layers are stacked. Accordingly, the insulating film 38 surrounding the outer peripheral surface of the light emitting layer 36 may prevent an electrical short that may occur when the light emitting layer 36 is in direct contact with an electrode through which an electrical signal is transmitted to the light emitting element 30. Further, because the insulating film 38 protects the outer surface of the light emitting element 30 as well as the light emitting layer 36, it is possible to prevent or reduce the deterioration in light emission efficiency.

Further, the outer surface (e.g., an outer peripheral surface) of the insulating film 38 may be surface-treated. The light emitting elements 30 may be aligned by being sprayed onto the electrodes in a state in which they are dispersed in an ink (e.g., a set or predetermined ink). Here, the surface of the insulating film 38 may be hydrophobically or hydrophilically treated in order to maintain the light emitting elements 30 in a dispersed state without being aggregated with other adjacent light emitting elements 30 in the ink. For example, the outer surface of the insulating film 38 may be surface-treated with a material such as stearic acid or 2,3-naphthalene dicarboxylic acid.

Hereinafter, a process of manufacturing a display device 10 will be described with reference to other drawings.

FIGS. 10-15 are cross-sectional views illustrating processes in a method of manufacturing a display device according to an embodiment.

Figure 10:
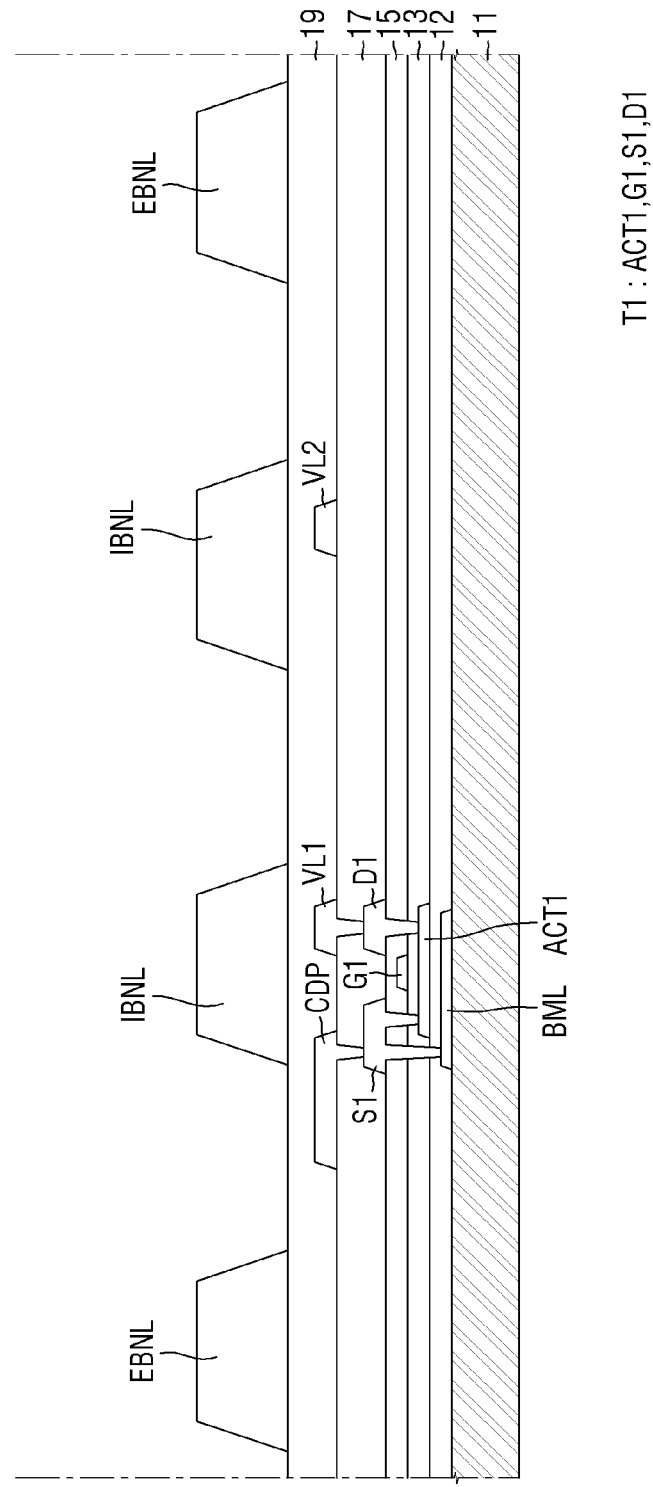
FIGS. 10-15 are cross-sectional views illustrating processes in a method of manufacturing a display device according to an embodiment.

Referring to FIG. 10, a substrate 11 on which a first transistor T1, voltage lines VL1 and VL2, a first conductive pattern CDP, and a first planarization layer 19 are disposed is provided. Inner banks IBNL and outer banks EBNL are formed on the first planarization layer 19. The inner banks IBNL and the outer banks EBNL may include an organic material including a photosensitive material, and may be formed through exposure and development after applying an organic material layer. The inner banks IBNL and the outer banks EBNL may be concurrently formed (e.g., simultaneously formed) by the same mask process.

Figure 11:
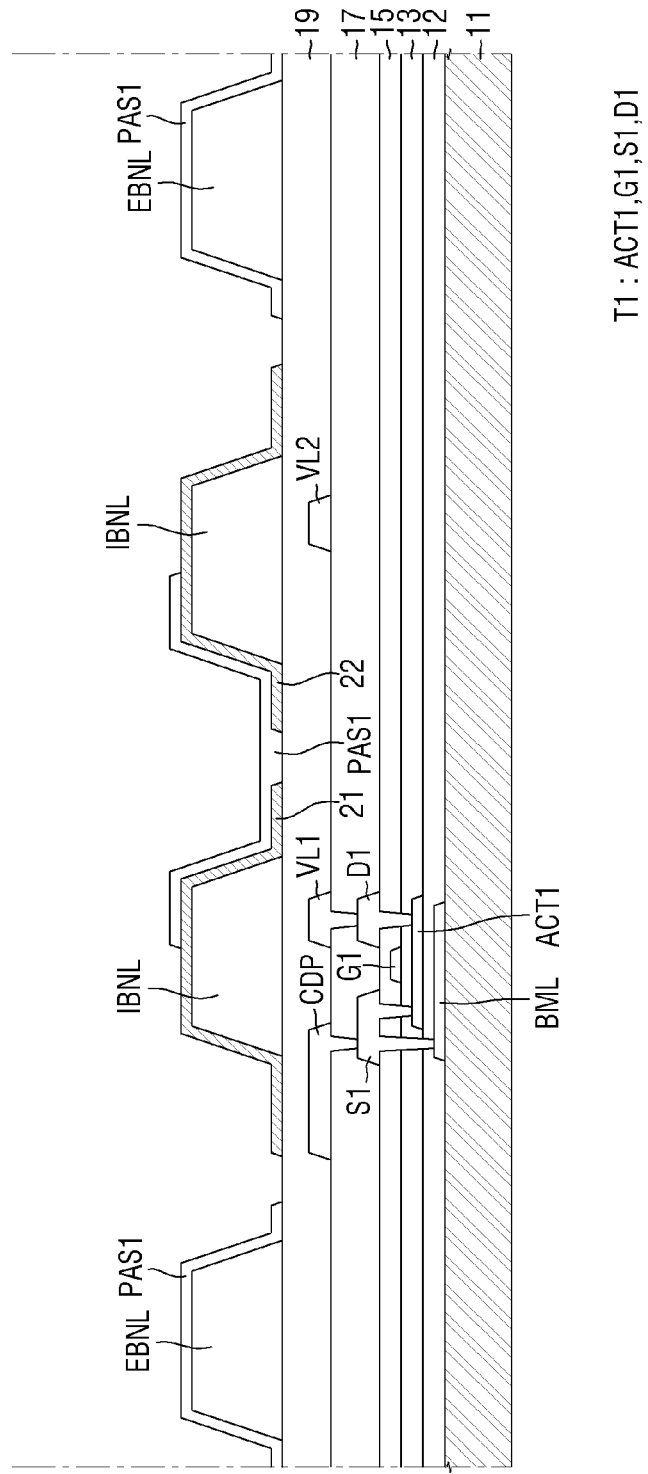

Subsequently, referring to FIG. 11, alignment electrodes 21 and 22 are formed on the first planarization layer 19 and the inner banks IBNL. The alignment electrodes 21 and 22 may be formed by a mask process. The alignment electrodes 21 and 22 may be formed by depositing an electrode material layer entirely on the first planarization layer 19 and the inner bank IBNL and then patterning the deposited electrode material layer. In the process of patterning the electrode material layer, the first alignment electrode 21 and the second alignment electrode 22 extend in one direction and are formed to have a shape spaced from each other.

Next, a first insulating layer PAS1 is formed on the substrate 11. The first insulating layer PAS1 may be formed by entirely depositing an insulating material layer on the substrate 11. The first insulating layer PAS1 is formed to cover the alignment electrodes 21 and 22 and the outer bank EBNL. The first insulating layer PAS1 is partially etched to expose one end of each of the alignment electrodes 21 and 22. Subsequently, the first planarization layer 19, the inner bank IBNL, the outer bank EBNL, and the alignment electrodes 21 and 22, which are arranged on the substrate 11, are hydrophobically treated. The hydrophobic treatment may prevent ink from overflowing to other adjacent sub-pixels PXn during an ink spraying process to be described later.

Figure 12:
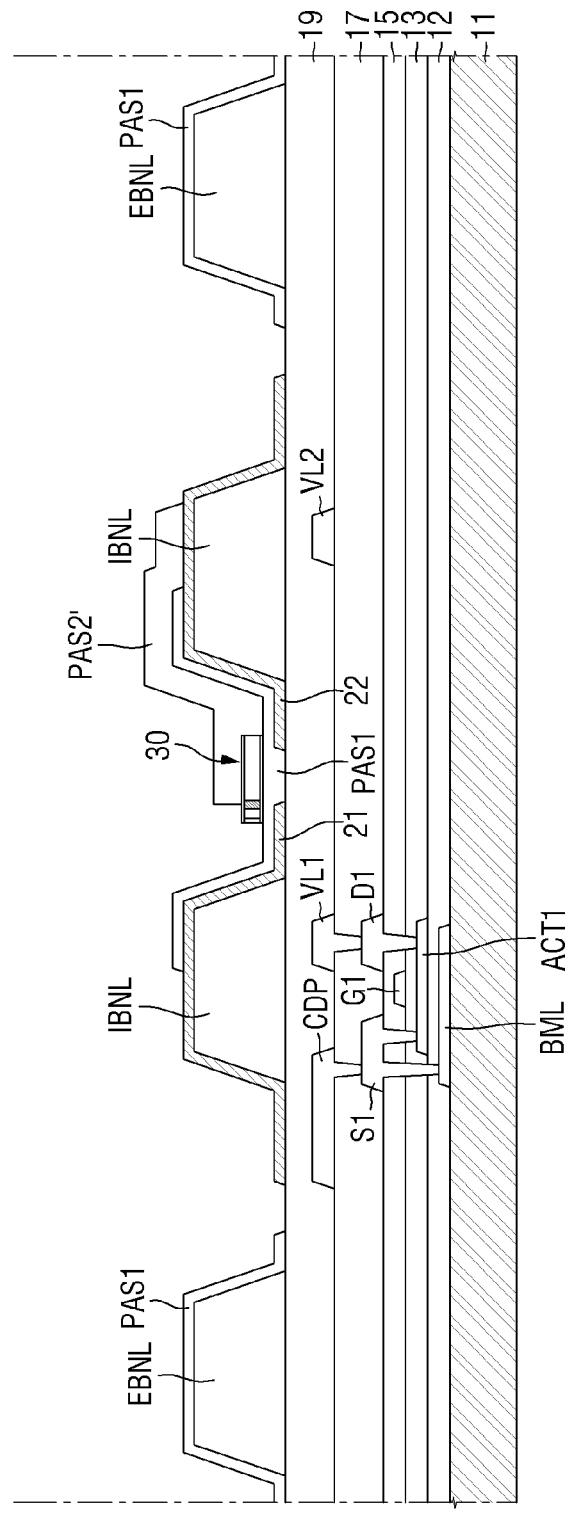

Subsequently, referring to FIG. 12, a light emitting element 30 is disposed on the first insulating layer PAS1. According to an embodiment, the light emitting element 30 may be disposed through an inkjet printing process in which the ink is sprayed onto the alignment electrodes 21 and 22 in a state where the light emitting element 30 is dispersed in the ink. The ink sprayed through an inkjet printing apparatus may be placed in an area surrounded by the outer bank EBNL. The outer bank EBNL may prevent ink from overflowing to the other adjacent sub-pixels PXn.

When the ink including the light emitting element 30 is sprayed, the plurality of light emitting elements 30 are disposed on the first insulating layer PAS1 by applying an electric signal to each of the alignment electrodes 21 and 22. When an electric signal is applied to the plurality of alignment electrodes 21 and 22, an electric field may be generated between the alignment electrodes 21 and 22. The light emitting element 30 dispersed in the ink may receive a dielectrophoretic force by the electric field, and the light emitting element 30 subjected to the dielectrophoretic force may be placed on the first insulating layer PAS1 between the alignment electrodes 21 and 22 while changing the orientation direction and position of the light emitting element 30.

Subsequently, a second insulating material layer PAS2' is formed on the substrate 11. The second insulating material layer PAS2' may be formed by entirely depositing an insulating material on the substrate 11. The second insulating material layer PAS2' may be formed to cover the second alignment electrode 22, at least a part of the light emitting element 30, and the first insulating layer PAS1, and other parts of second insulating material layer PAS2' may be etched to be removed. The second insulating material layer PAS2' is formed so as not to overlap the first alignment electrode 21 and the outer banks EBNL.

Figure 13:
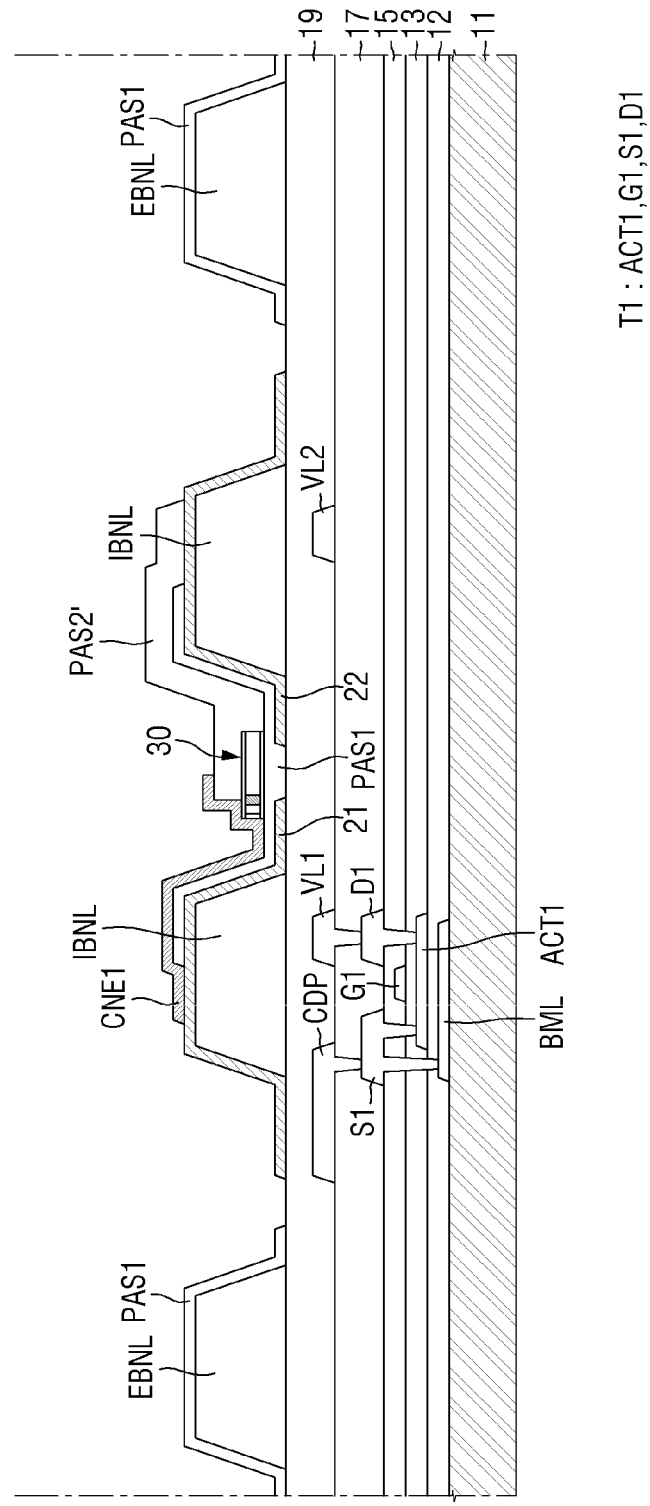

Subsequently, referring to FIG. 13, a first contact electrode CNE1 is formed on the first insulating layer PAS1. The first contact electrode CNE1 may be formed by entirely depositing a material layer for a contact electrode on the substrate 11 and then patterning the material layer so as to be disposed on the first insulating layer PAS1, the second insulating material layer PAS2', the first alignment electrode 21, and the light emitting element 30. A part of the first contact electrode CNE1 may contact the first alignment electrode 21, and the other part thereof may contact one end of the light emitting element 30. In some embodiments, during the patterning process of the first contact electrode CNE1, the connection between the first alignment electrode 21 and the second alignment electrode 22 exposed to the cut area CBA is cut.

Figure 14:
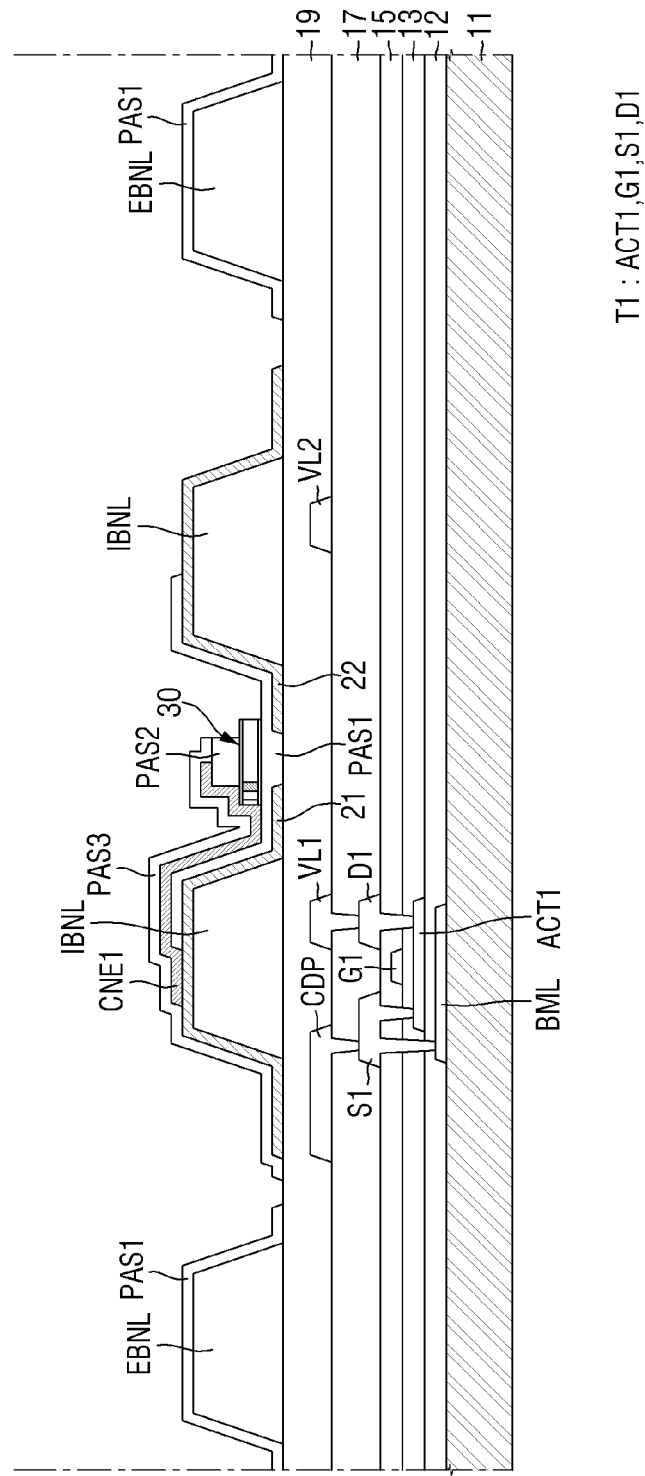

Subsequently, referring to FIG. 14, a third insulating layer PAS3 is formed on the substrate 11. The third insulating layer PAS3 may insulate the first contact electrode CNE1 so as to prevent the first contact electrode CNE1 from being connected to the second contact electrode CNE2. The third insulating layer PAS3 is formed by entirely depositing an insulating material layer on the substrate 11 and then patterning the deposited insulating material layer so as to cover the first alignment electrode 21, the first contact electrode CNE1, the first planarization layer 19, and the second insulating material layer PAS2'. When the third insulating layer PAS3 is patterned, the second insulating material layer PAS2' is also patterned, thereby concurrently forming (e.g., simultaneously forming) a second insulating layer PAS2 disposed on the light emitting element 30. Accordingly, one side of the second insulating layer PAS2 may be aligned with one side of the third insulating layer PAS3.

Figure 15:
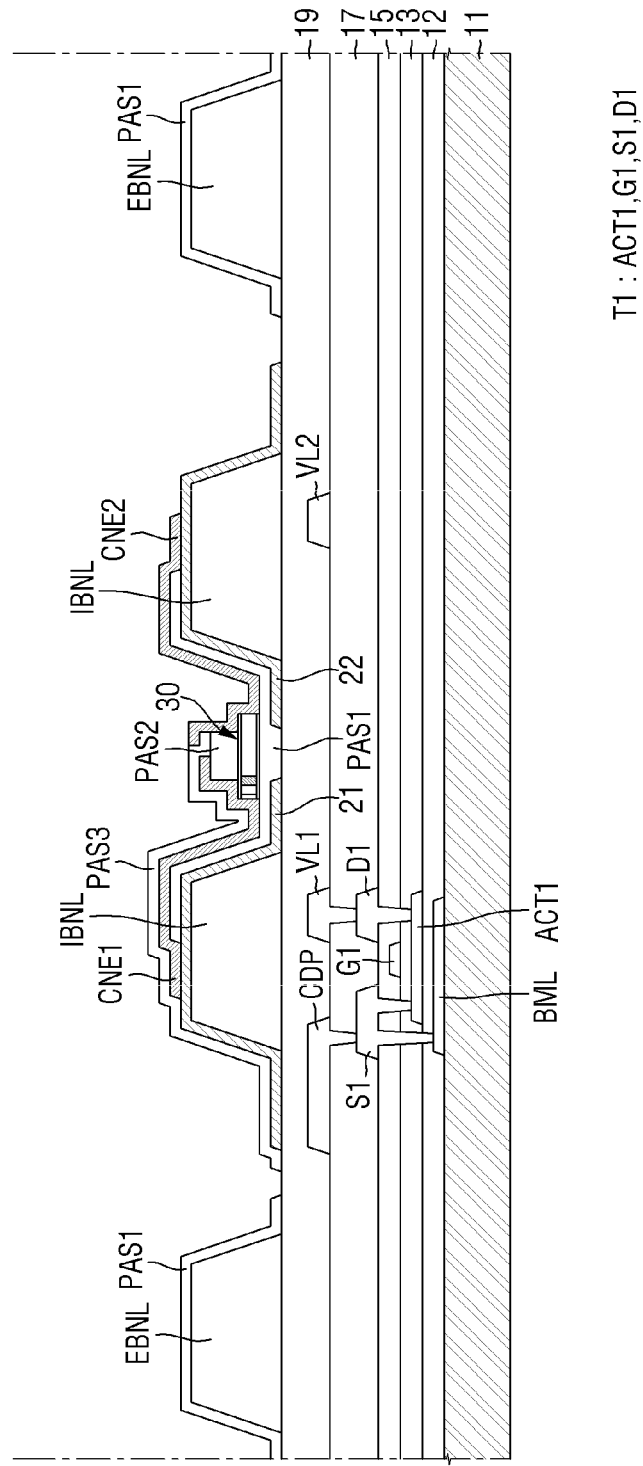

Subsequently, referring to FIG. 15, a second contact electrode CNE2 is formed on the first insulating layer PAS1. The second contact electrode CNE2 may be formed by entirely depositing a material layer for a contact electrode on the substrate 11 and then patterning the material layer so as to be disposed on the first insulating layer PAS1, the second insulating layer PAS2, the second alignment electrode 22, and the light emitting element 30. A part of the second contact electrode CNE2 may contact the second alignment electrode 22, and the other part thereof may contact the other end of the light emitting element 30.

In the above-described method of manufacturing a display device, because the inner bank IBNL and the outer bank EBNL are concurrently formed (e.g., simultaneously formed) by one mask process, the mask process may be simplified, and thus manufacturing cost may be reduced.

Figure 16:
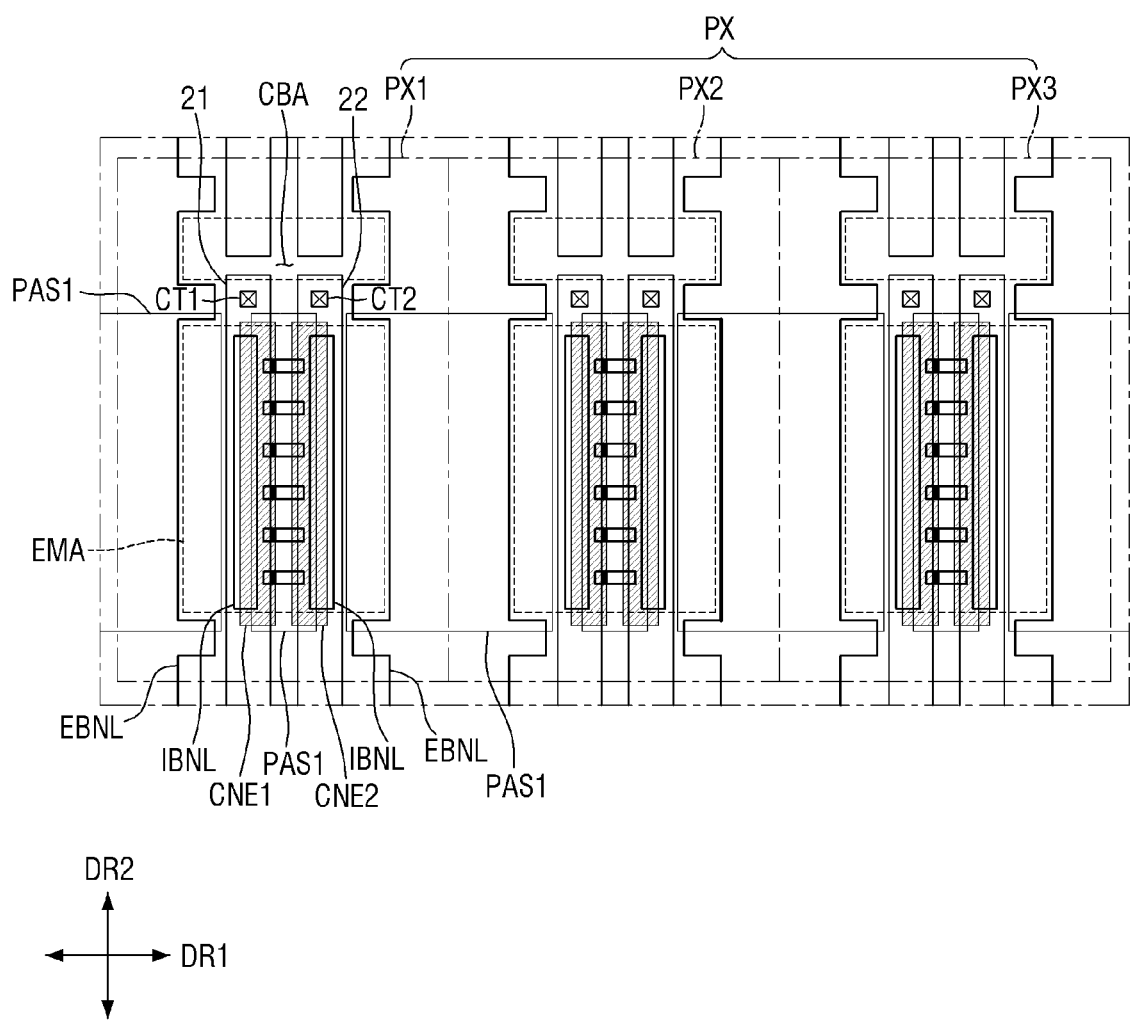
FIG. 16 is a plan view of a display device according to another embodiment.
Figure 17:
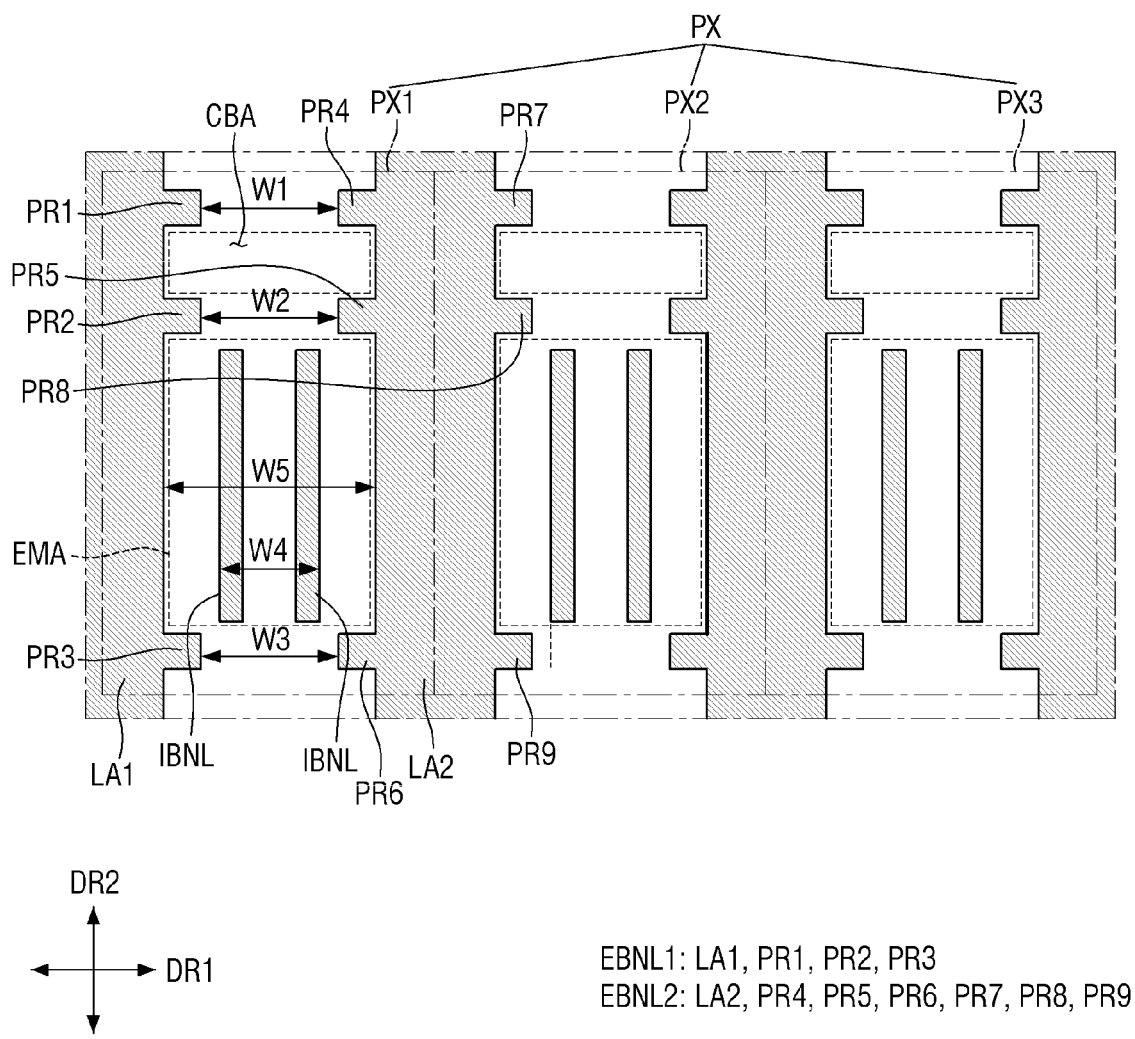
FIG. 17 is a plan view illustrating the inner bank and outer bank according to another embodiment.

FIG. 16 is a plan view of a display device according to another embodiment. FIG. 17 is a plan view illustrating the inner bank and outer bank according to another embodiment.

The embodiments of FIGS. 16 and 17 are different from the embodiments of FIGS. 2 and 7 in that an outer bank is shared with an adjacent sub-pixel PXn. Hereinafter, different outer banks will be described, and descriptions of the same configuration will be omitted.

Referring to FIGS. 16 and 17, a display device 10 according to another embodiment may include a plurality of outer banks EBNL. The plurality of outer banks EBNL have a shape extending in the second direction DR2 within each sub-pixel PXn, but may be disposed to extend to another adjacent sub-pixel PXn in the second direction DR2. For example, from among the plurality of outer banks EBNL dividing the first sub-pixel PX1, the outer bank EBNL adjacent to the second sub-pixel PX2 may divide both the first sub-pixel PX1 and the second sub-pixel PX2.

In an embodiment, the second outer bank EBNL2 may include a second linear portion LA2. The second outer bank EBNL2 may include fourth to sixth protrusion portions PR4, PR5, and PR6 protruding from the second linear portion LA2 toward the inner bank IBNL of the first sub-pixel PX1, and may include seventh to ninth protrusion portions PR7, PR8, and PR9 protruding from the second linear portion LA2 toward the inner bank IBNL of the second sub-pixel PX2. The fourth protrusion portion PR4 may be disposed at the same horizontal line as the seventh protrusion portion PR7, and the fifth protrusion portion PR5 may be disposed at the same horizontal line as the eighth protrusion portion PR8. The sixth protrusion portion PR6 may be disposed at the same horizontal line as the ninth protrusion portion PR9.

The present embodiment is different from the embodiment of FIGS. 2 and 7 in that the outer bank EBNL of the first sub-pixel PX1 is integrated with the outer bank EBNL of the second sub-pixel PX2. Although it is shown in the drawings that the width of the outer bank EBNL disposed between the first sub-pixel PX1 and the second sub-pixel PX2 is made thick, the present disclosure is not limited thereto, and the width of the outer bank EBNL may be made thin. Accordingly, an area occupied by the outer bank EBNL disposed between the first sub-pixel PX1 and the second sub-pixel PX2 may be reduced, thereby increasing the number of sub-pixels PXn. Further, it is possible to facilitate the processability of patterning the outer bank EBNL.

Figure 18:
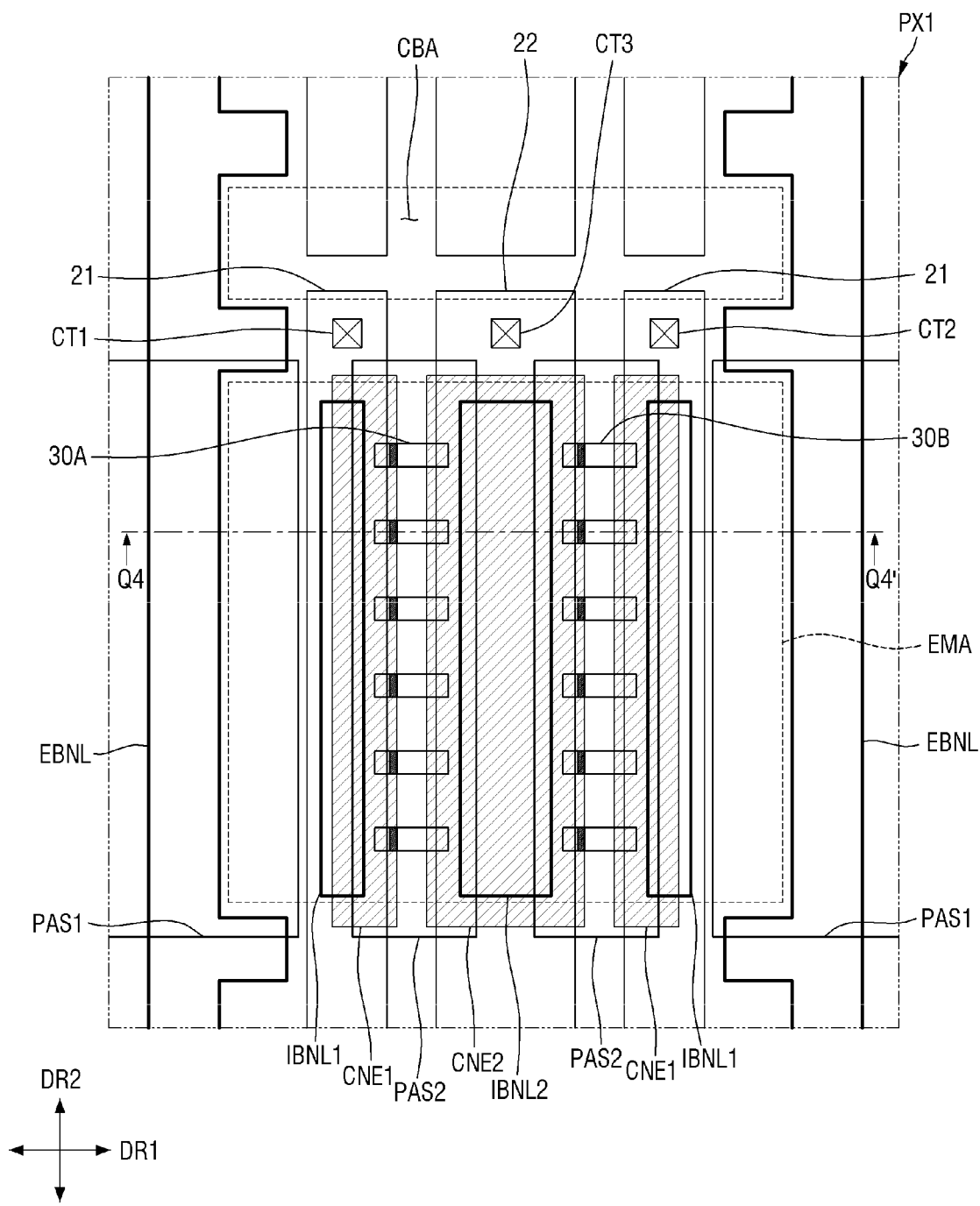
FIG. 18 is a plan view of a display device according to another embodiment.
Figure 19:
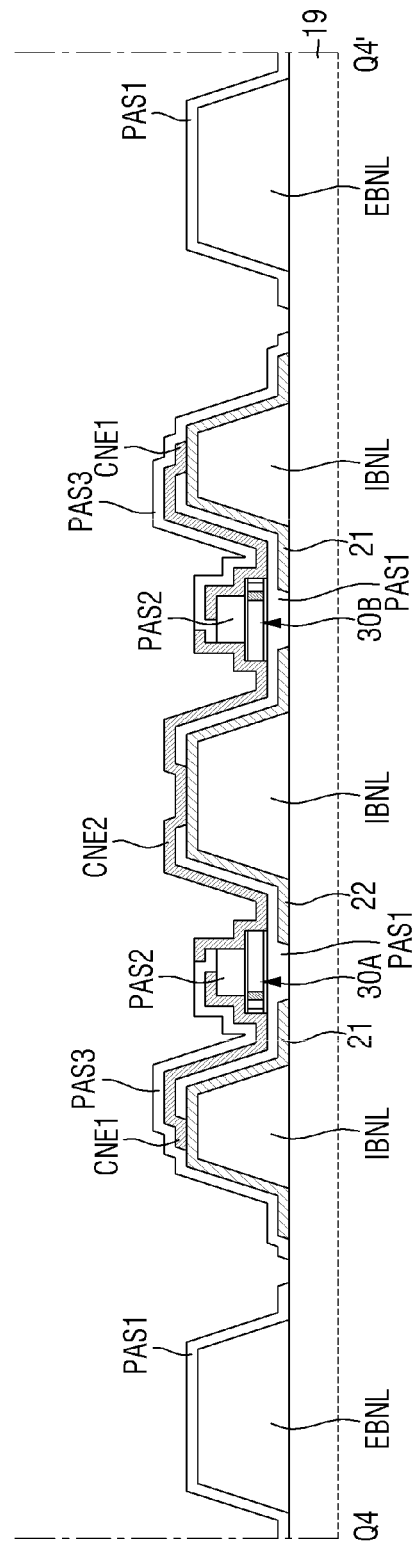
FIG. 19 is a cross-sectional view taken along the line Q4-Q4' of FIG. 18.

FIG. 18 is a plan view of a display device according to another embodiment. FIG. 19 is a cross-sectional view taken along the line Q4-Q4' of FIG. 18.

The embodiments of FIGS. 18 and 19 are different from the embodiments of FIGS. 3 and 5 in that two first alignment electrodes are provided, and in one sub-pixel PXn, light emitting elements 30 are arranged in two rows spaced in the first direction DR1. Hereinafter, differences will be described, and descriptions of the same configuration will be omitted.

Referring to FIGS. 18 and 19, a plurality of inner banks IBNL1 and IBNL2, a plurality of outer banks EBNL, a plurality of alignment electrodes 21 and 22, a light emitting element 30, and a plurality of contact electrodes CNE1 and CNE2 may be arranged on a first planarization layer 19. Further, a plurality of insulating layers PAS1, PAS2, and PAS3 may be disposed on the first planarization layer 19.

For example, a plurality of inner banks IBNL1 and IBNL2 and a plurality of outer banks EBNL may be arranged on the substrate 11. The plurality of inner banks IBNL1 and IBNL2 may include first inner banks IBNL1 and second inner banks IBNL2. The second inner bank IBNL2 may be disposed between the first inner banks IBNL1. For example, in one sub-pixel PXn, two first inner banks IBNL1 may be disposed to be spaced from each other with a second inner bank IBNL2 interposed therebetween, and light emitting elements 30 may be disposed therebetween. For example, light emitting elements 30 may be disposed between the adjacent ones of the first inner banks IBNL1 and the second inner banks IBNL2.

The plurality of alignment electrodes 21 and 22 are disposed on the plurality of inner banks IBNL1 and IBNL2 and the first planarization layer 19. The plurality of alignment electrodes 21 and 22 in each sub-pixel PXn may include a plurality of first alignment electrodes 21 and one second alignment electrode 22. The first alignment electrodes 21 may be disposed to be spaced from each other with the second alignment electrode 22 interposed therebetween. For example, the first alignment electrodes 21 may be disposed on the first inner bank IBNL1, and the second alignment electrode 22 may be disposed on the second inner bank IBNL2. The first alignment electrodes 21 may contact a first conductive pattern through first and second contact holes CT1 and CT2, and the second alignment electrode 22 may contact a second voltage line through a third contact hole CT3.

The first insulating layer PAS1 may be disposed to cover the inner banks IBNL1 and IBNL2, the outer banks EBNL, the first alignment electrodes 21, and the second alignment electrodes 22. The first insulating layer PAS1 may expose at least a part of each of the first alignment electrodes 21 and the second alignment electrodes 22. The first insulating layer PAS1 may cover one end of each of the first alignment electrodes 21 and both ends of the second alignment electrode 22. The first insulating layer PAS1 may expose the other end of each of the first alignment electrodes 21 and a part of the upper portion of the second alignment electrode 22. The other end of each of the first alignment electrodes 21 and a part of the upper portion of the second alignment electrode 22, which are exposed by the first insulating layer PAS1, may be in contact with the first contact electrode CNE1 and the second contact electrode CNE2, respectively. The first insulating layer PAS1 may overlap the inner banks IBNL1 and IBNL2 and the light emitting element 30 in the light emission area EMA to extend in the second direction DR2. The first insulating layers PAS1 may be disposed in an island-shaped pattern.

The light emitting elements 30 may be disposed between the adjacent ones of the first alignment electrodes 21 and the second alignment electrodes 22 on the first insulating layer PAS1. The light emitting elements 30 may include a first light emitting element 30A and a second light emitting element 30B. For example, the first light emitting element 30A and the second light emitting element 30B disposed between the first inner bank IBNL1 and the second inner bank IBNL2 may be disposed symmetrically to each other based on the second inner bank IBNL2.

Each of the first contact electrodes CNE1 may be disposed on the first inner bank IBNL1, and the second contact electrode CNE2 may be disposed on the second inner bank IBNL2. One end of the first light emitting element 30A may contact the first contact electrode CNE1, and the other end thereof may contact the second contact electrode CNE2. One end of the second light emitting element 30B may contact the first contact electrode CNE1, and the other end thereof may contact the second contact electrode CNE2.

In the above-described embodiment, the first light emitting elements 30A and the second light emitting elements 30B spaced in the first direction DR1 may be included in one sub-pixel PXn, and the second inner bank IBNL2 and the second alignment electrode CNE2 may be disposed between the first light emitting elements 30A and the second light emitting elements 30B. Accordingly, luminance may be improved by increasing the number of light emitting elements capable of emitting light in one sub-pixel PXn.

In concluding the detailed description, those skilled in the art will appreciate that many variations and modifications can be made to the embodiments without substantially departing from the principles of the present disclosure. Therefore, the disclosed embodiments of the disclosure are used in a generic and descriptive sense only and not for purposes of limitation. The present disclosure is also defined in the following claims, and equivalents thereof.

What is claimed is:

1. A method of manufacturing a display device comprising a substrate comprising a planarization layer, the method comprising:
   concurrently forming a plurality of inner banks and a plurality of outer banks extending in a first direction and spaced from each other on the planarization layer in a second direction crossing the first direction, each of the plurality of outer banks extending past ends of the plurality of inner banks in the first direction;
   forming a first alignment electrode and a second alignment electrode on the plurality of inner banks;
   aligning a light emitting element between the first alignment electrode and the second alignment electrode; and
   forming a first contact electrode contacting a first end of the light emitting element on the first alignment electrode and forming a second contact electrode contacting a second end of the light emitting element on the second alignment electrode.

2. The method of claim 1, wherein the plurality of inner banks and the plurality of outer banks have a same height.

3. The method of claim 1, wherein the plurality of inner banks have an island shape, and the plurality of outer banks have a line shape.

4. The method of claim 1, wherein the plurality of outer banks comprises a first outer bank and a second outer bank, and
   wherein the first outer bank comprises a protrusion portion protruding in the second direction toward the second outer bank on the planarization layer.

5. The method of claim 4, wherein the protrusion portion of the first outer bank is at a position of the first outer bank beyond the ends of the plurality of inner banks.

* * * * *